(12) United States Patent
Haynie et al.

(10) Patent No.: US 10,978,559 B1
(45) Date of Patent: Apr. 13, 2021

(54) MOS TRANSISTOR WITH FOLDED CHANNEL AND FOLDED DRIFT REGION

(71) Applicant: Texas Instruments Incorporated, Dallas, TX (US)

(72) Inventors: Sheldon Douglas Haynie, Morgan Hill, CA (US); Alexei Sadovnikov, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/983,585

(22) Filed: Aug. 3, 2020

(51) Int. Cl.
*H01L 29/10* (2006.01)
*H01L 29/78* (2006.01)
*H01L 29/66* (2006.01)
*H01L 29/40* (2006.01)

(52) U.S. Cl.
CPC ........ *H01L 29/1045* (2013.01); *H01L 29/402* (2013.01); *H01L 29/66681* (2013.01); *H01L 29/7816* (2013.01)

(58) Field of Classification Search
CPC ........... H01L 29/1045; H01L 29/66681; H01L 29/7816; H01L 29/402
See application file for complete search history.

(56) References Cited

U.S. PATENT DOCUMENTS

| 5,640,034 A | 6/1997 | Malhi |
| 8,253,193 B2 | 8/2012 | Denison et al. |
| 8,575,015 B2 | 11/2013 | Denison |
| 2009/0273026 A1 | 11/2009 | Wilson et al. |
| 2012/0098062 A1* | 4/2012 | Pendharkar ......... H01L 29/0653 257/337 |
| 2012/0104493 A1* | 5/2012 | Denison ............ H01L 21/76224 257/339 |

* cited by examiner

*Primary Examiner* — Mohammed R Alam
(74) *Attorney, Agent, or Firm* — Jacqueline J. Garner; Charles A. Brill; Frank D. Cimino

(57) ABSTRACT

A semiconductor device includes a folded drain extended metal oxide semiconductor (DEMOS) transistor. The semiconductor device has a substrate including a semiconductor material with a corrugated top surface. The corrugated top surface has an upper portion, a lower portion, a first lateral portion extending from the upper portion to the lower portion, and a second lateral portion extending from the upper portion to the lower portion. The folded DEMOS transistor includes a body in the semiconductor material, a gate on a gate dielectric layer over the body, a drift region contacting the body, and a field plate on a field plate dielectric layer, all extending continuously along the upper portion, the first lateral portion, the second lateral portion, and the lower portion of the corrugated top surface. Methods of forming the folded DEMOS transistor are disclosed.

20 Claims, 19 Drawing Sheets

MOS TRANSISTOR WITH FOLDED CHANNEL AND FOLDED DRIFT REGION

FIELD

This disclosure relates to the field of semiconductor devices. More particularly, but not exclusively, this disclosure relates to metal oxide semiconductor (MOS) transistors in semiconductor devices.

BACKGROUND

Semiconductor devices often have one or more metal oxide semiconductor (MOS) transistors with extended drains, commonly referred to as extended drain MOS transistors. An extended drain MOS transistor may be operated with a higher potential on the drain than on the gate, and may be used in a power circuit. Demands for improvements in current density and reductions in specific on resistance are increasing.

SUMMARY

The present disclosure introduces a semiconductor device including a folded drain extended metal oxide semiconductor (DEMOS) transistor. The semiconductor device has a substrate including a semiconductor material with a corrugated top surface having an upper portion, a lower portion, a first lateral portion extending from the upper portion to the lower portion, and a second lateral portion extending from the upper portion to the lower portion. The folded DEMOS transistor includes a body which extends continuously along the upper portion, the first lateral portion, the second lateral portion, and the lower portion. The folded DEMOS transistor includes a gate dielectric layer on the body and a gate on the gate dielectric layer, both extending continuously along the upper portion, the first lateral portion, the second lateral portion, and the lower portion. The folded DEMOS transistor also includes a drift region contacting the body continuously along the upper portion, the first lateral portion, the second lateral portion, and the lower portion. The folded DEMOS transistor further includes a field plate dielectric layer on the drift region and a field plate on the field plate dielectric layer, both extending continuously along the upper portion, the first lateral portion, the second lateral portion, and the lower portion. Methods of forming the folded DEMOS transistor are disclosed.

DETAILED DESCRIPTION

Figure 1A:
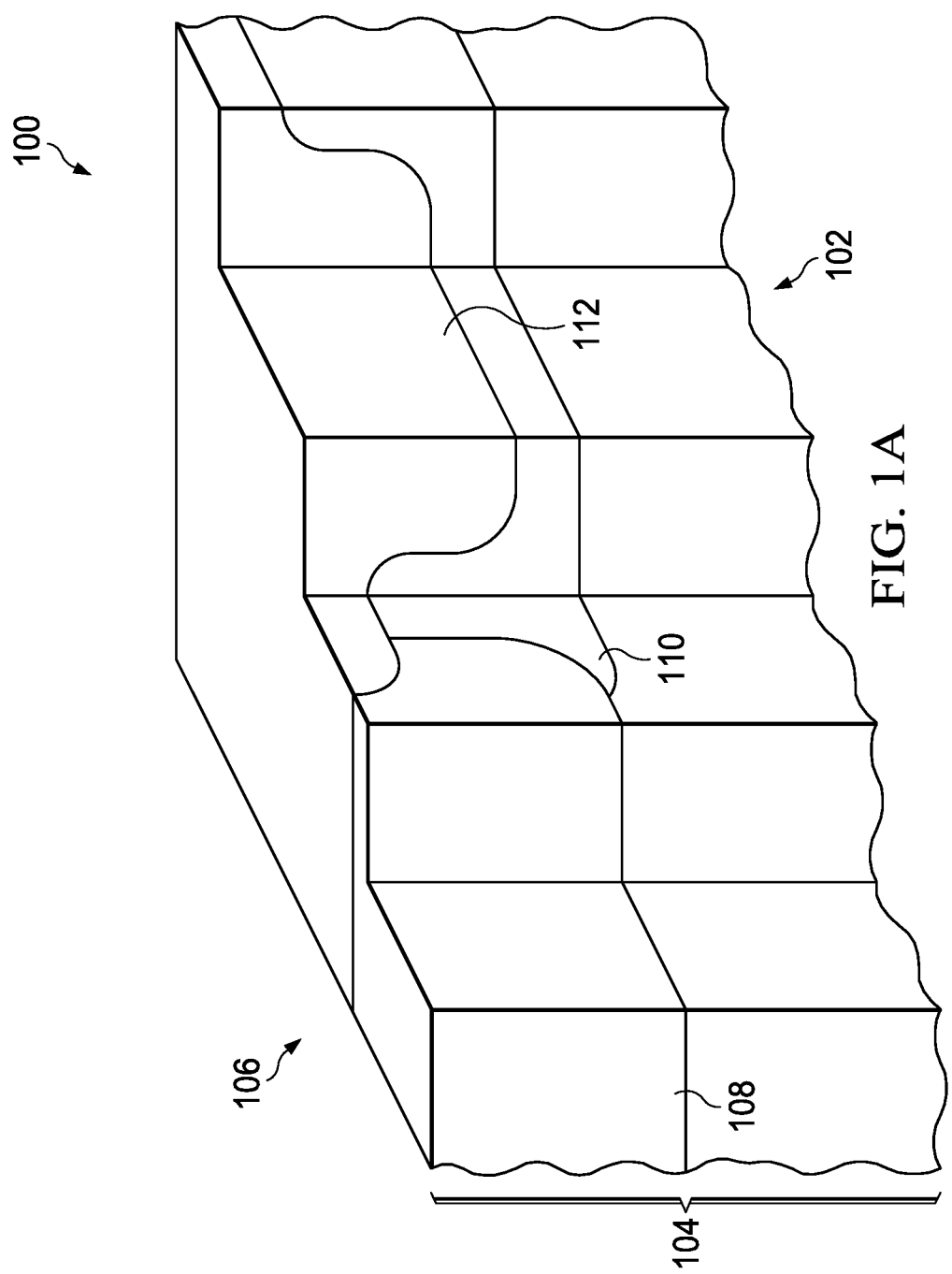
FIG. 1A through FIG. 1J are cross sections of a semiconductor device that includes a folded DEMOS transistor, depicted in stages of an example method of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A semiconductor device has a substrate that includes a semiconductor material. The semiconductor material has a corrugated top surface, with an upper portion, a lower portion, a first lateral portion extending from the upper portion to the lower portion, and a second lateral portion extending from the upper portion to the lower portion. The corrugated top surface may be manifested by one or more trenches in the semiconductor material, or by one more fins of the semiconductor material. The semiconductor device includes a folded drain extended metal oxide semiconductor (DEMOS) transistor. The folded DEMOS transistor includes a body in the semiconductor material, a gate dielectric layer on the body, and a gate on the gate dielectric layer. The folded DEMOS transistor further includes a drift region in the semiconductor material contacting the body, a field plate dielectric layer on the drift region, and a field plate on the field plate dielectric layer. The body and the drift region both extend continuously along the upper portion, the first lateral portion, the second lateral portion, and the lower portion of the corrugated top surface of the semiconductor material. The gate dielectric layer, the gate, the field plate dielectric layer, and the field plate all extend continuously along the upper portion, the first lateral portion, the second lateral portion, and the lower portion. During operation of the semiconductor device, when the folded DEMOS transistor is operated in an on state, current may flow through the body and the drift region continuously along the upper portion, the first lateral portion, the second lateral portion, and the lower portion, which may advantageously improve a current density of the folded DEMOS transistor compared to a planar DEMOS transistor.

It is noted that terms such as top, bottom, upper, lower, over, above, under, and below may be used in this disclosure. These terms should not be construed as limiting the position or orientation of a structure or element, but should be used to provide spatial relationship between structures or elements. For the purposes of this disclosure, when it is disclosed that a structural element extends continuously along the upper portion, the first lateral portion, the second lateral portion, and the lower portion, the structural element may directly contact the upper portion, the first lateral portion, the second lateral portion, and the lower portion, or may extend parallel to the upper portion, the first lateral portion, the second lateral portion, and the lower portion, separated from the upper portion, the first lateral portion, the second lateral portion, and the lower portion by another structural element.

FIG. 1A through FIG. 1J are cross sections of a semiconductor device that includes a folded DEMOS transistor, depicted in stages of an example method of formation. Referring to FIG. 1A, the semiconductor device 100 is formed in and on a substrate 102 that includes a semiconductor material 104. The substrate 102 may be implemented as a semiconductor wafer that includes other semiconductor devices, not shown. The semiconductor material 104 may be implemented as silicon, by way of example. The semiconductor material 104 may have a first conductivity type, which is p-type in this example. The semiconductor material 104 may have an average resistivity of 10 ohm-cm to 100 ohm cm, by way of example. Other implementations of the substrate 102 and the semiconductor material 104 are within the scope of this example. The semiconductor device 100 includes the folded DEMOS transistor 106. It is to be noted that in the Specification as well as in all of the Figures, the respective structures will be termed the semiconductor device and the folded DEMOS transistor, and will be referred to by the numbers 100 and 106, even though the structures are not completely formed until some of the last stages of formation described herein. This is done primarily for the convenience of the reader. In this example, the folded DEMOS transistor 106 will be described as an n-channel transistor. A p-channel version of the folded DEMOS transistor 106 is within the scope of this example, and may be formed by appropriate changes in polarities of dopants.

The semiconductor material 104 includes a body 108 of the folded DEMOS transistor 106. The body 108 has the first conductivity type, which is p-type in this example. The body 108 may be implemented as a portion of the semiconductor material 104 without introducing additional dopants. Alternatively, first conductivity type dopants may be introduced into the body 108 to provide a desired threshold voltage for the folded DEMOS transistor 106. The term "first conductivity type dopants" and the term "second conductivity type dopants" are understood to mean dopants which provide the first conductivity type and dopants which provide the second conductivity type, respectively, in the semiconductor material 104. In versions of this example in which the semiconductor material 104 is implemented as silicon, and the first conductivity type is p-type, boron, gallium, and indium are first conductivity type dopants, as they provide p-type conductivity in the semiconductor material 104, while the second conductivity type is n-type, and phosphorus, arsenic, and antimony are second conductivity type dopants, as they provide n-type conductivity in the semiconductor material 104.

A charge balance region 110 of the folded DEMOS transistor 106 is formed in the semiconductor material 104 of the substrate 102. The charge balance region 110 has the first conductivity type, which is p-type in this example. The charge balance region 110 may be formed by implanting first conductivity type dopants, such as boron in this example, into the semiconductor material 104, using a charge balance implant mask, not shown, followed by heating the semiconductor material 104, so that the first conductivity type dopants diffuse into the semiconductor material 104 and become activated. The charge balance region 110 may have an average net concentration of first conductivity type dopants of $1 \times 10^{16}$ cm$^{-3}$ to $1 \times 10^{18}$ cm$^{-3}$, by way of example. The term average net concentration of first conductivity type dopants refers to an average concentration of the first conductivity type dopants minus an average concentration of second conductivity type dopants, where the second conductivity type dopants provide a second conductivity type, n-type in this example, that is opposite from the first conductivity type. The second conductivity type dopants may include phosphorus, arsenic, or antimony in this example. The charge balance region 110 may extend to the body 108, as depicted in FIG. 1A.

A drift region 112 of the folded DEMOS transistor 106 is formed in the semiconductor material 104. The drift region 112 has a second conductivity type, opposite from the first conductivity type. In this example, the second conductivity type is n-type. The drift region 112 may be formed by implanting second conductivity type dopants, such as phosphorus in this example, into the semiconductor material 104, using a drift region implant mask, not shown. The semiconductor material 104 is subsequently heated to diffuse and activate the second conductivity type dopants. The semiconductor material 104 may be heated after both the first conductivity type dopants and the second conductivity type dopants are implanted, to concurrently diffuse and activate both sets of dopants. The drift region 112 may have an average net concentration of second conductivity type dopants that is 65 percent to 150 percent of the average net concentration of first conductivity type dopants of the charge balance region 110, which may advantageously reduce an electric field in the drift region 112 during operation of the folded DEMOS transistor 106. The drift region 112 extends to the body 108. In this example, the drift region 112 may be surrounded by, and contacted by, the charge balance region 110, as depicted in FIG. 1A.

Figure 1B:
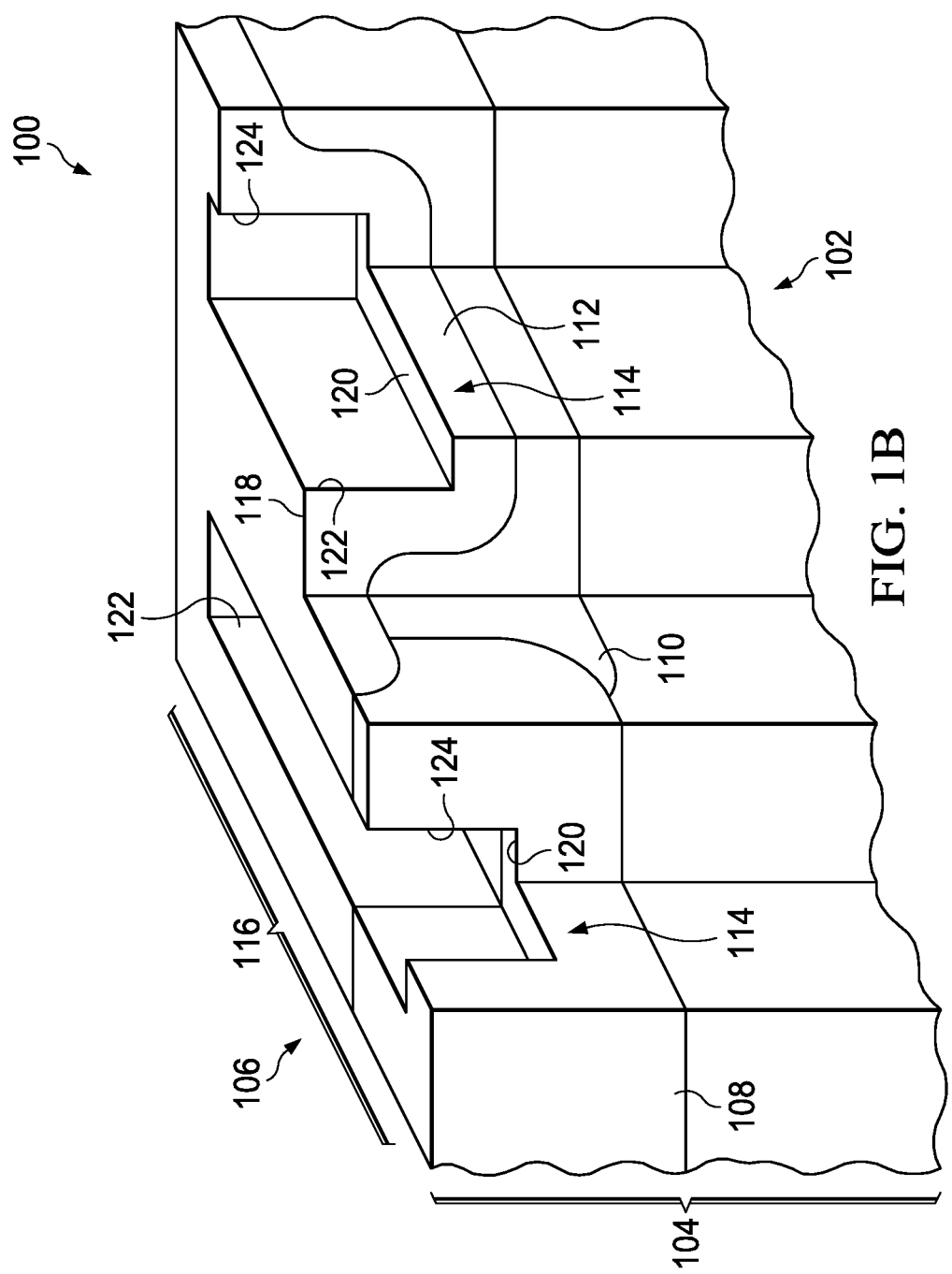

Referring to FIG. 1B, trenches 114 are formed in the semiconductor material 104 so as to form a corrugated top surface 116 of the semiconductor material 104. In this example, the trenches 114 extend partway through the body 108 and partway through the drift region 112 and the charge balance region 110, and may terminate in the body 108 and in the drift region 112, as depicted in FIG. 1B. Other configurations of the trenches 114 with respect to the body 108, the drift region 112, and the charge balance region 110 are within the scope of this example. The trenches 114 may be formed by a reactive ion etch (RIE) process using fluorine radicals, by way of example. The trenches 114 may have an average depth of 400 nanometers to 1200 nanometers, by way of example. Having the average depth at 400 nanometers to 1200 nanometers may advantageously provide a higher current capacity for the folded DEMOS transistor 106 compared to a planar DEMOS transistor, while advantageously enabling formation of the folded DEMOS transistor 106 using planar processes concurrently with other components, such as planar transistors, in the semiconductor device 100.

The corrugated top surface 116 includes an upper portion 118, a lower portion 120, first lateral portions 122 extending from the upper portion 118 to the lower portion 120, and second lateral portions 124 extending from the upper portion 118 to the lower portion 120. A top surface of the semiconductor material 104 at tops of the trenches 114 may provide the upper portion 118. Bottoms of the trenches 114 may provide the lower portion 120. Sidewalls of the trenches 114 may provide first lateral portions 122 and the second lateral portions 124. The upper portion 118 may have a width between adjacent trenches 114 that is 40 percent to 60 percent of the average depth of the trenches 114. The lower portion 120 may have a width in each trench 114 that is 40 percent to 60 percent of the average depth of the trenches 114. Having the width of the upper portion 118 between adjacent trenches 114 at 40 percent to 60 percent of the average depth of the trenches 114 may result in depletion of the drift region 112 along the first lateral portions 122 and the second lateral portions 124 during operation of the folded DEMOS transistor 106, which may advantageously enable operation of the folded DEMOS transistor 106 at a higher drain potential than would otherwise be possible. Having the width of the lower portion 120 in each trench 114 that is 40 percent to 60 percent of the average depth of the trenches 114 may facilitate subsequent formation of layer in the trenches 114 compared to having a lesser width. The drift region 112 contacts the body 108 continuously along the upper portion 118, the first lateral portions 122, the second lateral portions 124, and the lower portion 120 of the corrugated top surface 116. The charge balance region 110 may contact the drift region 112 between the first lateral portions 122 and the second lateral portions 124. The lower portion 120 is depicted in FIG. 1B as flat, but may in fact be rounded due to non-uniformity in removal of the semiconductor material 104 to form the trenches 114. The first lateral portions 122 and the second lateral portions 124 may be angled at 84 degrees to 88 degrees with respect to the upper portion 118, to facilitate subsequent formation of layers in the trenches 114.

In an alternate version of this example, the trenches 114 may have a tapered configuration, so that the drift region 112 between the first lateral portions 122 and the second lateral portions 124 is wider than the body 108 between the first lateral portions 122 and the second lateral portions 124. Having the drift region 112 wider than the body 108 may advantageously provide a lower resistance for the folded DEMOS transistor 106.

Figure 1C:
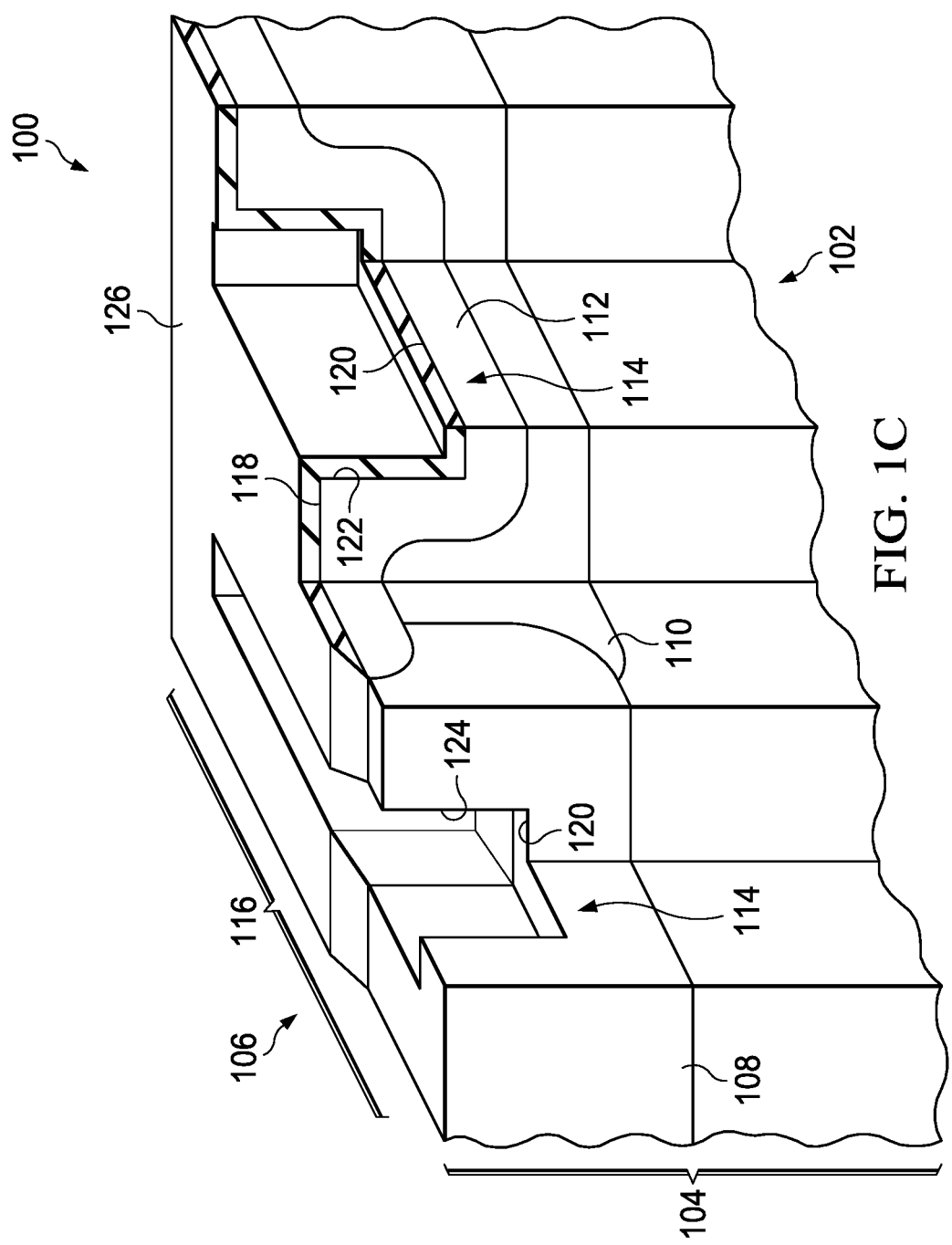

Referring to FIG. 1C, a field plate dielectric layer 126 of the folded DEMOS transistor 106 is formed on the drift region 112, extending continuously along the upper portion 118, the first lateral portions 122, the second lateral portions 124, and the lower portion 120 of the corrugated top surface 116. The field plate dielectric layer 126 extends proximate to the body 108, and may partially overlap the body 108. The field plate dielectric layer 126 may be formed by forming a first sublayer, not shown, on the drift region 112 and forming a second sublayer, not shown, on the first sublayer. The first sublayer may consist essentially of silicon dioxide, may be 5 nanometers to 20 nanometers thick, and may be formed by a thermal oxidation process, to advantageously provide a stable interface with the drift region 112. The second sublayer may include primarily silicon dioxide, may be 30 nanometers to 60 nanometers thick, and may be formed by a plasma enhanced chemical vapor deposition (PECVD) process using tetraethoxysilane (TEOS), also referred to as tetraethyl orthosilicate. A field plate dielectric etch mask, not shown, may be formed over the second sublayer, covering an area for the field plate dielectric layer 126. The first sublayer and the second sublayer are removed where exposed by the field plate dielectric etch mask, to form the field plate dielectric layer 126. The first sublayer and the second sublayer may be removed where exposed by the field plate dielectric etch mask by a wet etch process using a dilute buffered aqueous solution of hydrofluoric acid, to provide a tapered edge profile on the field plate dielectric layer 126. The tapered edge profile may advantageously provide a smoothly continuous electric field in the drift region 112 during operation of the folded DEMOS transistor 106. The field plate dielectric etch mask is subsequently removed. Other structures, compositions, and methods of forming the field plate dielectric layer 126 are within the scope of this example. In an alternate version of this example, the field plate dielectric layer 126 may fill the trenches 114 over the drift region 112, which may provide additional process latitude for forming the field plate dielectric layer 126, by enabling a non-conformal deposition process for the second sublayer of the field plate dielectric layer 126.

Figure 1D:
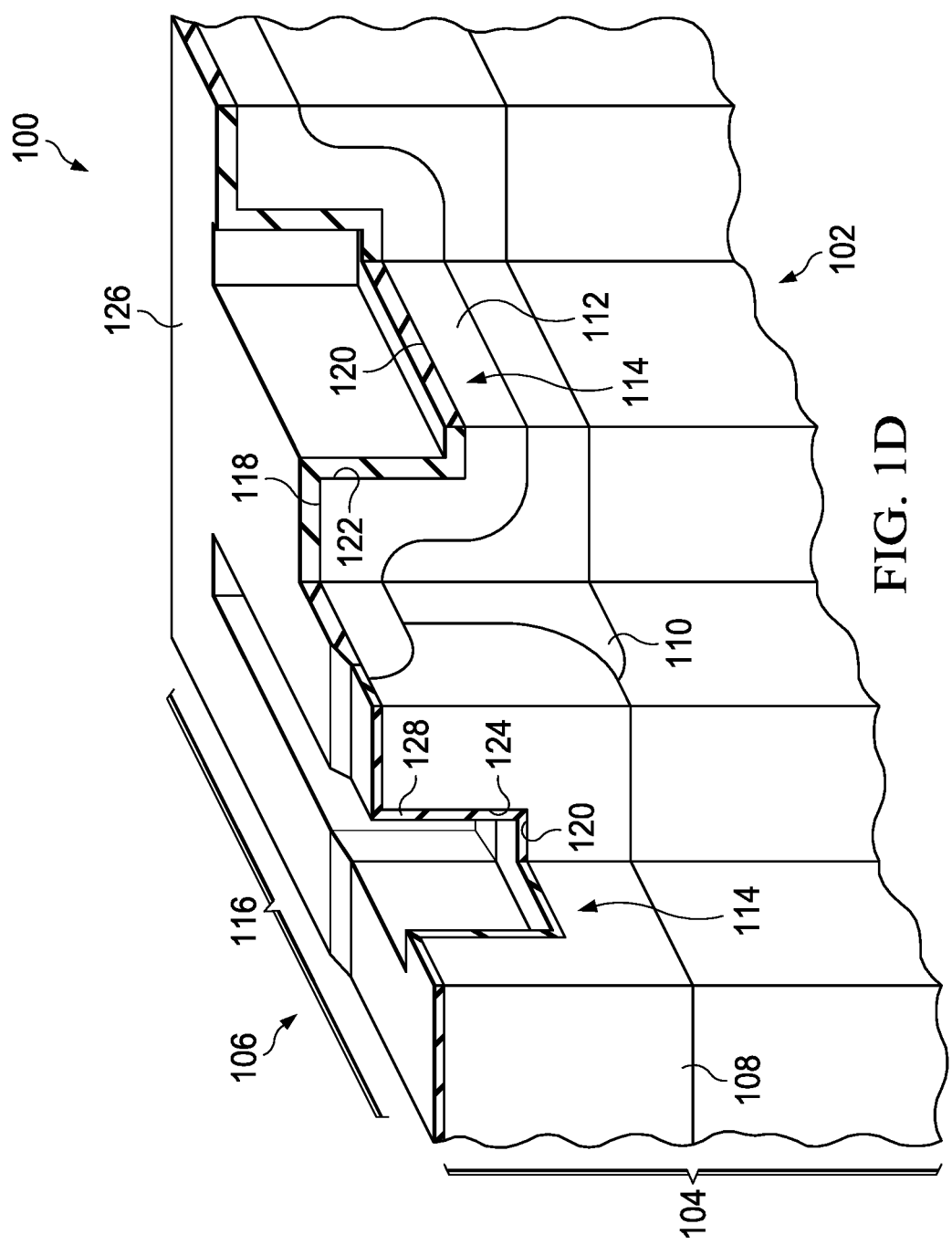

Referring to FIG. 1D, a gate dielectric layer 128 is formed on the body 108, extending continuously along the upper portion 118, the first lateral portions 122, the second lateral portions 124, and the lower portion 120 of the corrugated top surface 116. The gate dielectric layer 128 extends to the field plate dielectric layer 126. The gate dielectric layer 128 may be formed by a thermal oxidation process, and may include primarily silicon dioxide, 3 nanometers to 10 nanometers thick. Nitrogen may be introduced into the gate dielectric layer 128 by exposing the gate dielectric layer 128 to a nitrogen-containing plasma. Further, the gate dielectric layer 128 may include high dielectric constant material, such as hafnium oxide, zirconium oxide, or tantalum oxide.

Figure 1E:
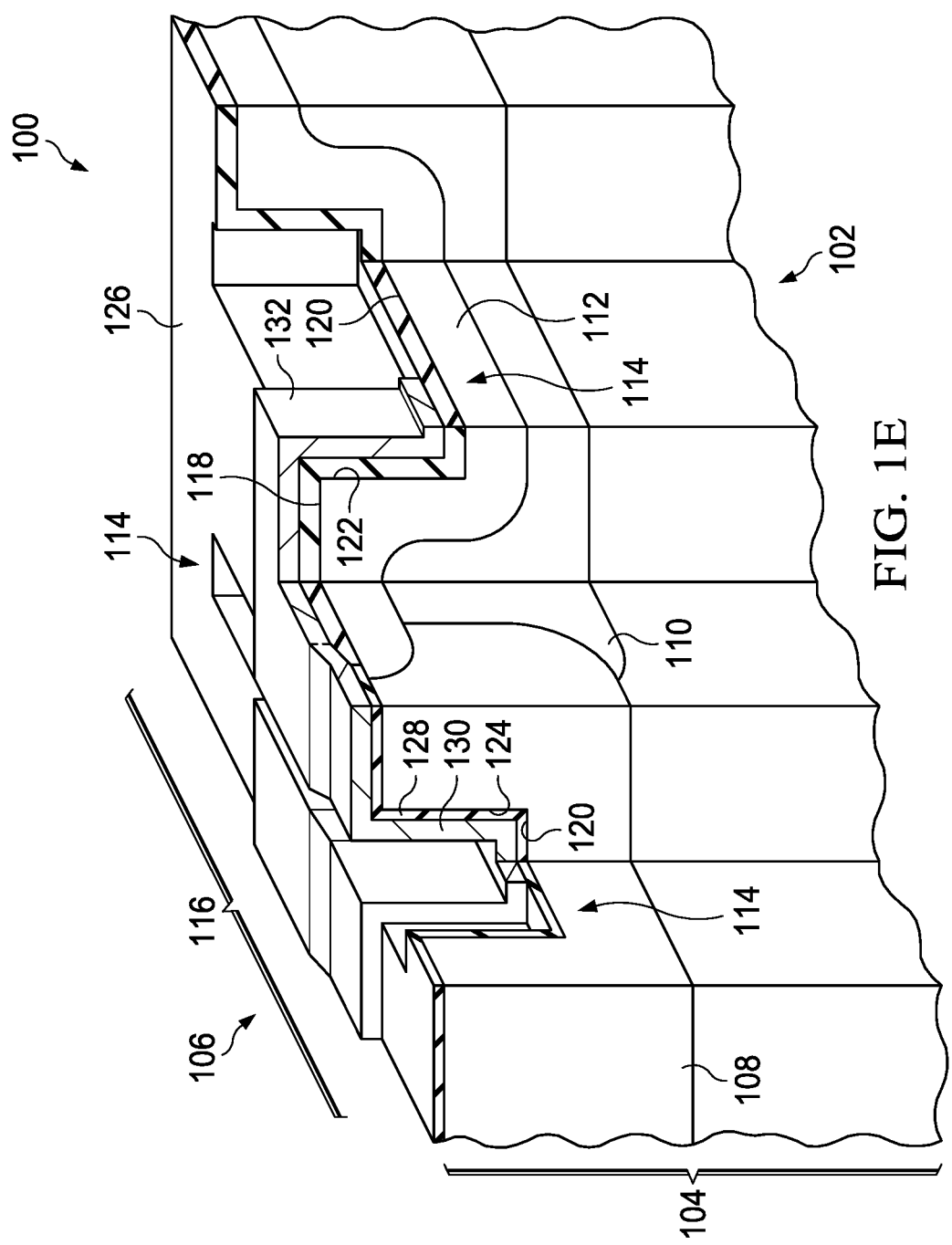

Referring to FIG. 1E, a gate 130 is formed on the gate dielectric layer 128 and a field plate 132 is formed on the field plate dielectric layer 126. In this example, the gate 130 may be continuous with the field plate 132, as indicated in FIG. 1E. The gate 130 and the field plate 132 may be formed concurrently, in this example, by forming a gate/field plate layer, not shown, on the gate dielectric layer 128 and on the field plate dielectric layer 126. The gate/field plate layer may include polycrystalline silicon, commonly referred to as polysilicon, or other gate material such as titanium nitride or titanium silicide. A gate/field plate etch mask is formed over the gate/field plate layer that covers areas for the gate 130 and the field plate 132. The gate/field plate layer is removed where exposed by the gate/field plate etch mask, leaving the gate/field plate etch mask on the gate dielectric layer 128 and on the field plate dielectric layer 126 to provide the gate 130 and the field plate 132. The gate/field plate etch mask is subsequently removed. The gate 130 extends on the gate dielectric layer 128 continuously along the upper portion 118, the first lateral portions 122, the second lateral portions 124, and the lower portion 120 of the corrugated top surface 116. The field plate 132 extends on the field plate dielectric layer 126 continuously along the upper portion 118, the first lateral portions 122, the second lateral portions 124, and the lower portion 120 of the corrugated top surface 116. In an alternate version of this example, the gate 130 and the field plate 132 may fill the trenches 114, which may provide increased process latitude for deposition of the gate/field plate layer.

Figure 1F:
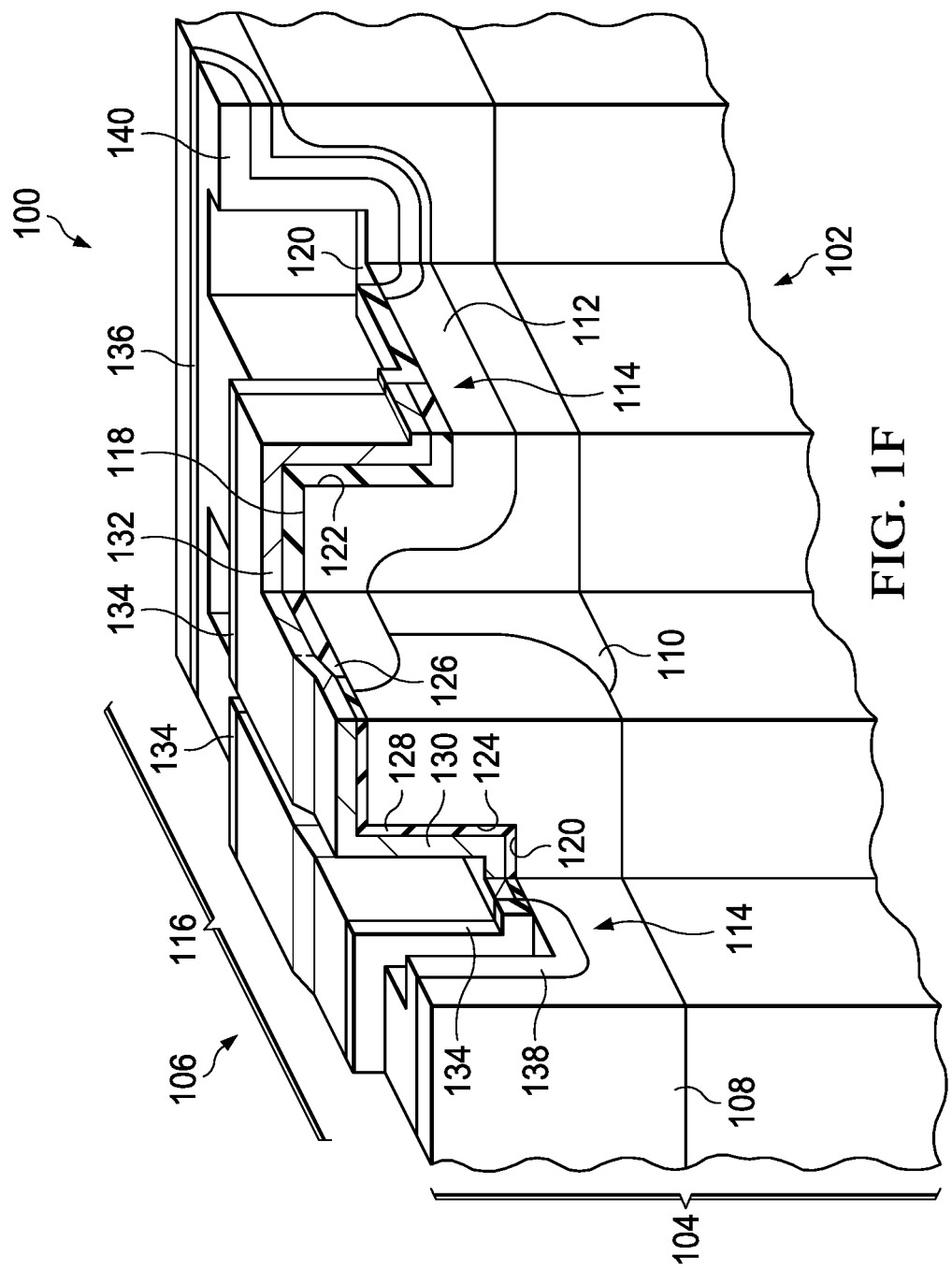

Referring to FIG. 1F, the gate dielectric layer 128 may optionally be removed where exposed by the gate 130. The field plate dielectric layer 126 is removed where exposed by the field plate 132. A protective oxide layer, not shown, may be formed on the semiconductor material 104 in areas where the gate dielectric layer 128 and the field plate dielectric layer 126 were removed. Sidewall spacers 134 are formed on sides of the gate 130 and the field plate 132. The sidewall spacers 134 may include one or more layers of silicon dioxide, silicon nitride, or silicon oxynitride. The sidewall spacers 134 may be formed by forming conformal layers of silicon dioxide, silicon nitride, or silicon oxynitride, by one or more PECVD processes, using TEOS or bis(tertiary-butyl-amino)silane (BTBAS), for example. The conformal layers may be removed from horizontal surfaces of the semiconductor device 100 by an anisotropic etch process such as an RIE process, leaving the conformal layers on the sides of the gate 130 and the field plate 132 to provide the sidewall spacers 134.

An optional intermediate drain region 136 may be formed in the semiconductor material 104 adjacent to, and contacting the drift region 112, opposite from the body 108. The intermediate drain region 136 has the second conductivity type, and may have an average net concentration of second conductivity type dopants that is 2 to 4 times the average net concentration of second conductivity type dopants of the drift region 112. The intermediate drain region 136 contacts the drift region 112 continuously along the upper portion 118, the first lateral portions 122, the second lateral portions 124, and the lower portion 120 of the corrugated top surface 116. The intermediate drain region 136 may be formed by implanting second conductivity type dopants such as phosphorus or a combination of phosphorus and arsenic into the semiconductor material 104 adjacent to the field plate 132. The intermediate drain region 136 may reduce an electric field in the drift region 112 during operation of the folded DEMOS transistor 106, advantageously enabling operation of the folded DEMOS transistor 106 at a high drain potential than a comparable transistor lacking an intermediate drain region.

A source 138 is formed in the semiconductor material 104 adjacent to, and contacting, the body 108, opposite from the drift region 112. The source 138 has the second conductivity type. In this example, the source 138 contacts the body 108 continuously along the upper portion 118, the first lateral portions 122, the second lateral portions 124, and the lower portion 120 of the corrugated top surface 116.

A drain contact region 140 is formed in the semiconductor material 104. The drain contact region 140 is electrically coupled to the drift region 112. In versions of this example in which the optional intermediate drain region 136 is formed, the drain contact region 140 is separated from the drift region 112 by the intermediate drain region 136, as indicated in FIG. 1F, and is electrically coupled to the drift region 112 through the intermediate drain region 136. In versions of this example in which the optional intermediate drain region 136 is omitted, the drain contact region 140 directly contacts the drift region 112, opposite from the body 108. The drain contact region 140 of this example is electrically coupled to the drift region 112 continuously along the upper portion 118, the first lateral portions 122, the second lateral portions 124, and the lower portion 120 of the corrugated top surface 116. The drain contact region 140 has the second conductivity type.

The source 138 and the drain contact region 140 may be formed concurrently by implanting second conductivity type dopants into the semiconductor material 104. The source 138 and the drain contact region 140 have average net concentrations of second conductivity type dopants higher than the drift region 112. The source 138 and the drain contact region 140 may have average net concentrations of second conductivity type dopants of $5 \times 10^{18}$ cm$^{-3}$ to $5 \times 10^{20}$ cm$^{-3}$, to provide low resistance connections to the folded DEMOS transistor 106, which may advantageously improve a current density of the folded DEMOS transistor 106.

Figure 1G:
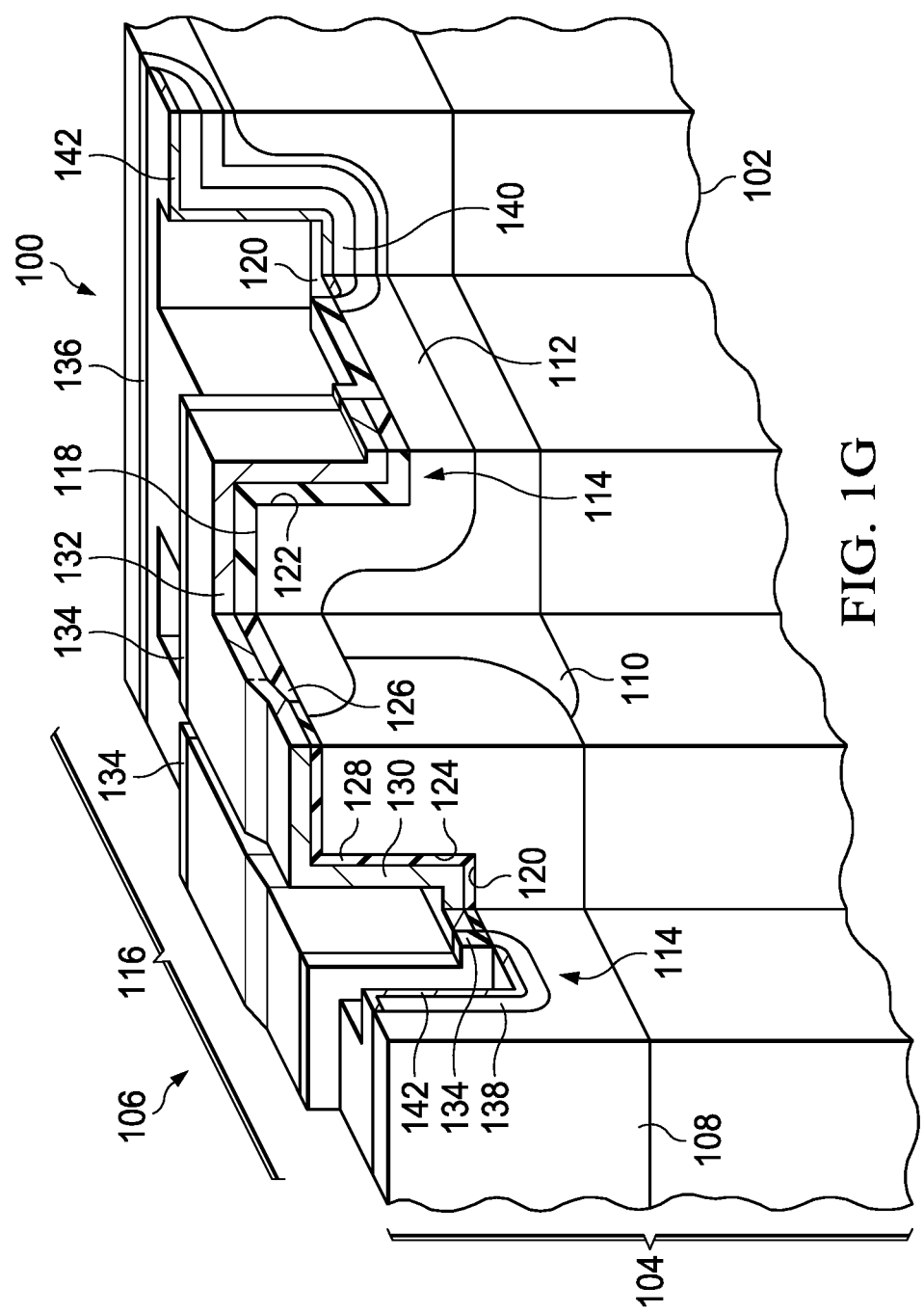

Referring to FIG. 1G, metal silicide 142 may be formed on the source 138 and the drain contact region 140. The metal silicide 142 may be formed by forming a metal layer, not shown, on the source 138 and the drain contact region 140, extending into the trenches 114 and contacting the source 138 and the drain contact region 140 continuously along the upper portion 118, the first lateral portions 122, the second lateral portions 124, and the lower portion 120 of the corrugated top surface 116. The metal layer includes one or more metals suitable for forming the metal silicide 142, such as titanium, cobalt, nickel, or platinum. The metal layer may be formed by a sputter process, an ion plating process, or metal organic chemical deposition (MOCVD) process, to provide more uniform coverage of the first lateral portions 122, the second lateral portions 124, and the lower portion 120. The substrate 102 is heated, causing the metal in the metal layer to react with silicon in the source 138 and the drain contact region 140, forming the metal silicide 142. Unreacted metal of the metal layer is removed by a wet etch process, leaving the metal silicide 142 on the source 138 and the drain contact region 140. In versions of this example in which the gate 130 and the field plate 132 include polysilicon, the metal silicide 142 may also be formed on the gate 130 and the field plate 132. The metal silicide 142 may advantageously provide low resistance connections to the source 138 and the drain contact region 140. Having the metal silicide 142 extending continuously along the upper portion 118, the first lateral portions 122, the second lateral portions 124, and the lower portion 120 of the corrugated top surface 116 may advantageously provide uniform low resistance connections to the source 138 and the drain contact region 140.

Figure 1H:
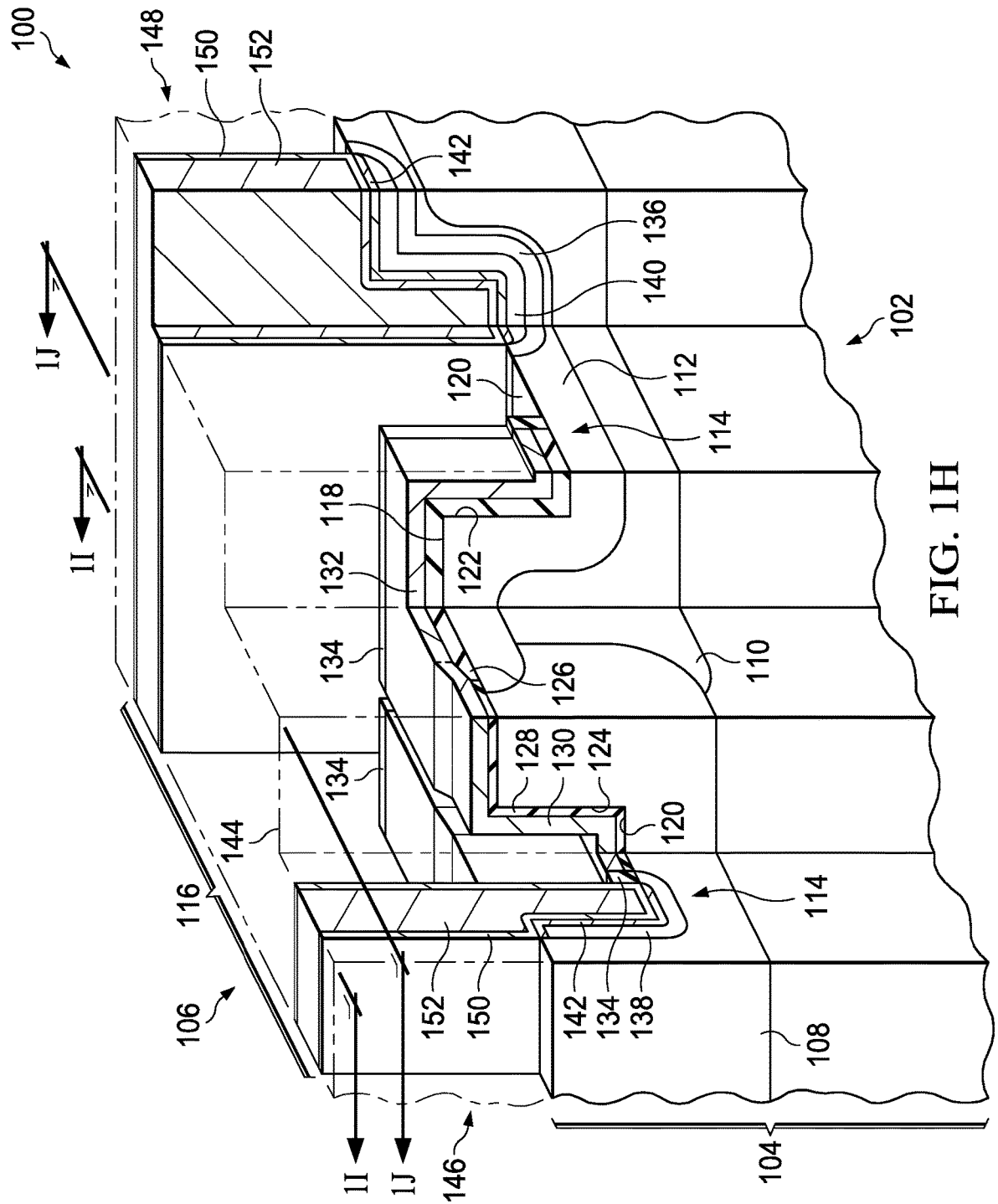

Referring to FIG. 1H, a pre-metal dielectric (PMD) layer 144 is formed over the folded DEMOS transistor 106, extending over the substrate 102. The PMD layer 144 may include, by way of example, a PMD liner, formed on the folded DEMOS transistor 106, a PMD main layer, formed on the PMD liner, and a cap layer, formed on the PMD main layer. The PMD liner may include one or more layers of silicon dioxide, silicon nitride, or silicon oxynitride, and may be formed by a PECVD process or a low pressure chemical vapor deposition (LPCVD) process. The PMD main layer may include primarily silicon dioxide, silicon dioxide with hydrogen, phosphosilicate glass (PSG), or borophosphosilicate glass (BPSG), by way of example, and may be formed by a PECVD process, an atmospheric pressure chemical vapor deposition (APCVD) process, a high density plasma (HDP) process, or a high aspect ratio process (HARP) using ozone. The cap layer may include silicon nitride, silicon carbide, silicon carbide nitride, or other material suitable for a stop layer for a chemical mechanical polish (CMP) process. The cap layer may be formed by a PECVD process, for example.

A source contact 146 is formed on the metal silicide 142 on the source 138, and a drain contact 148 is formed on the metal silicide 142 on the drain contact region 140. The source contact 146 and the drain contact 148 may be formed concurrently, by removing the PMD layer 144 from contact slots over the source 138 and the drain contact region 140 by a two-step RIE process, in which a first RIE process removes the cap layer and the PMD main layer, stopping on the PMD liner, and a second RIE process removes the PMD liner, stopping on the metal silicide 142. A contact liner 150 is formed on the metal silicide 142, and a contact fill layer 152 is formed on the contact liner 150. The contact liner 150 may include titanium and titanium nitride, and may be formed by a titanium sputter process followed by a titanium nitride ion plating process or a titanium nitride atomic layer deposition (ALD) process. The contact fill layer 152 may include tungsten, and may be formed by a tungsten MOCVD process in which tungsten hexafluoride is reduced initially by silane and subsequently by hydrogen. Having the first lateral portions 122 and the second lateral portions 124 angled at 84 degrees to 88 degrees with respect to the upper portion 118 may advantageously enable forming the contact fill layer 152 with reduced voids and seams compared to a comparable transistor with lateral portions at 90 degrees. The contact liner 150 and the contact fill layer 152 may extend over the PMD layer 144. A tungsten CMP process is used to remove the contact fill layer 152 and the contact liner 150 from over the PMD layer 144, leaving the contact fill layer 152 and the contact liner 150 in the contact slots to provide the source contact 146 and the drain contact 148. The source contact 146 and the drain contact 148 in this example extend continuously along the upper portion 118, the first lateral portions 122, the second lateral portions 124, and the lower portion 120 of the corrugated top surface 116, which may advantageously provide more uniform current through the folded DEMOS transistor 106 compared to a comparable transistor having discrete contacts.

Figure 1I:
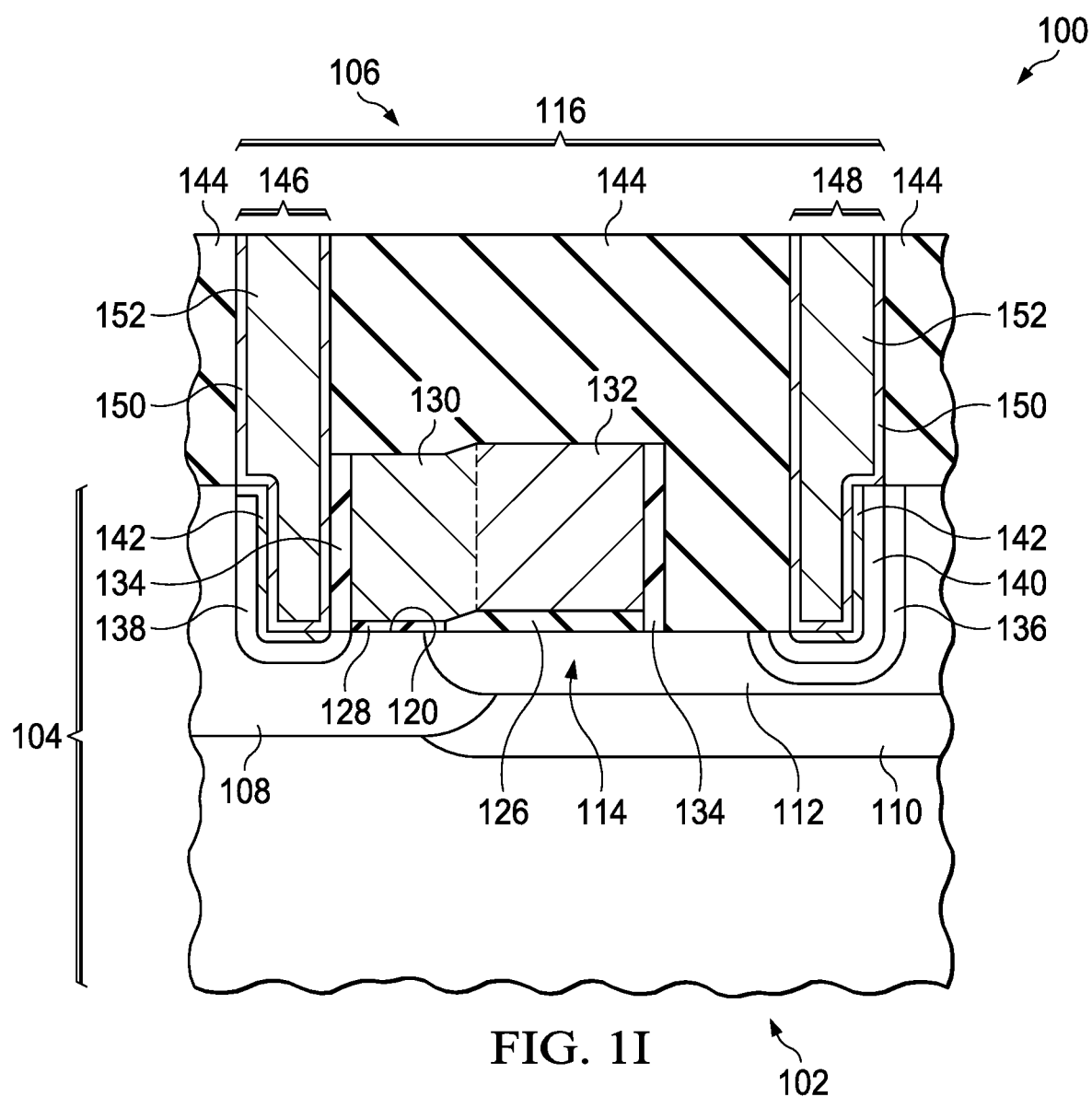

FIG. 1I is a cross section of the semiconductor device 100 through one of the trenches 114. In this example, the trenches 114 extend from the source 138 to the drain contact region 140. The source 138 may optionally extend past the trenches 114, as depicted in FIG. 1I. Alternatively, the trenches 114 may extend past the source 138. The drain contact region 140 may optionally extend past the trenches 114, as depicted in FIG. 1I. Alternatively, the trenches 114 may extend past the drain contact region 140. The charge balance region 110 extends below the drift region 112 under the lower portion 120 of the corrugated top surface 116. The source 138, the body 108, the gate dielectric layer 128, the gate 130, the field plate dielectric layer 126, the field plate 132, the drift region 112, the intermediate drain region 136, the drain contact region 140, the metal silicide 142, the source contact 146, and the drain contact 148 extend along the lower portion 120 of the corrugated top surface 116.

Figure 1J:
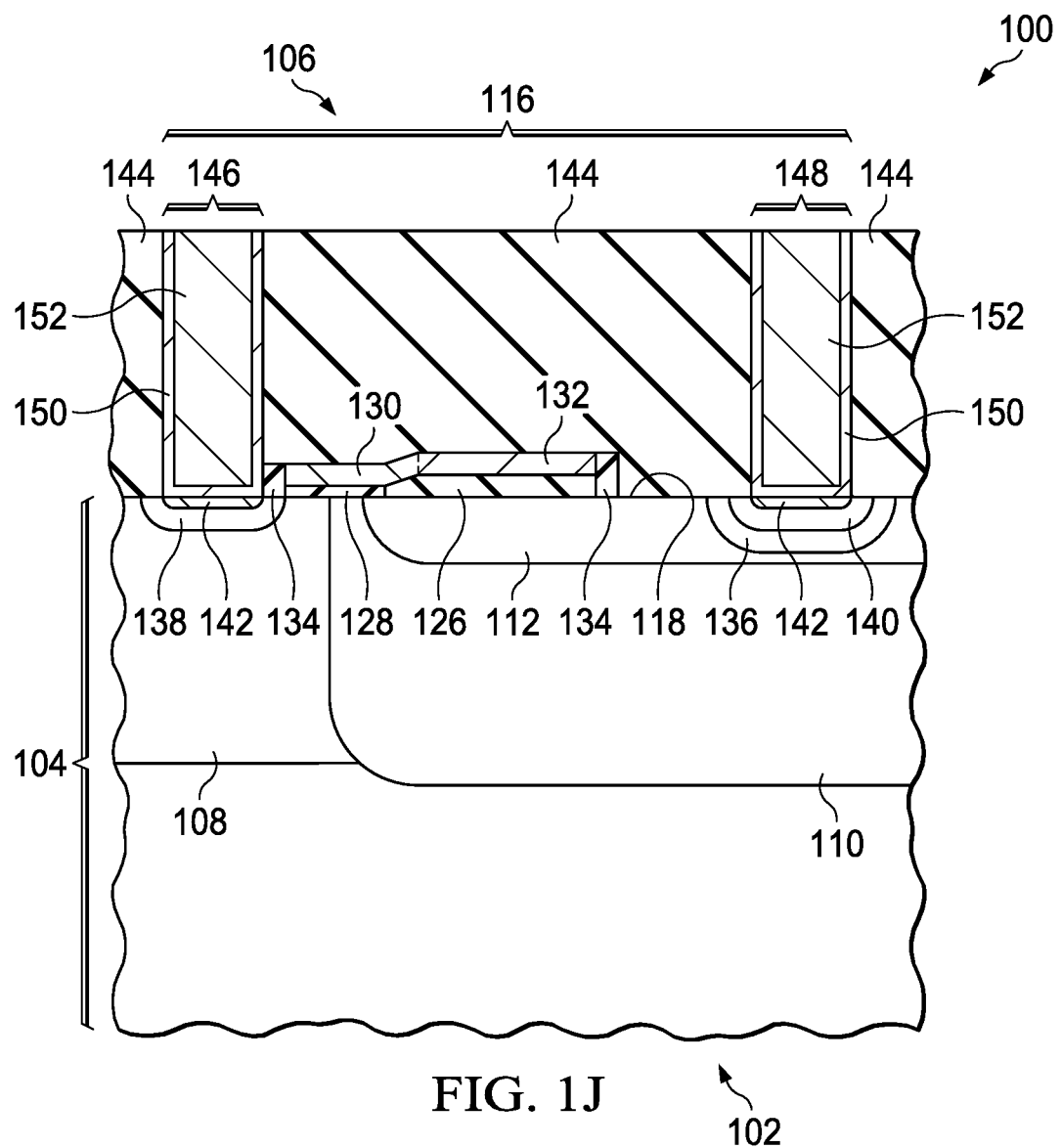

FIG. 1J is a cross section of the semiconductor device 100 through a plane between two adjacent trenches 114 of FIG. 1H. The charge balance region 110 extends below the drift region 112 sufficiently deep to contact the drift region 112 along the first lateral portions 122 and the second lateral portions 124 of FIG. 1H, of the corrugated top surface 116; the first lateral portions 122 and the second lateral portions 124 are out of the plane of FIG. 1J. The source 138, the body 108, the gate dielectric layer 128, the gate 130, the field plate dielectric layer 126, the field plate 132, the drift region 112, the intermediate drain region 136, the drain contact region 140, the metal silicide 142, the source contact 146, and the drain contact 148 extend along the upper portion 118 of the corrugated top surface 116.

Figure 2A:
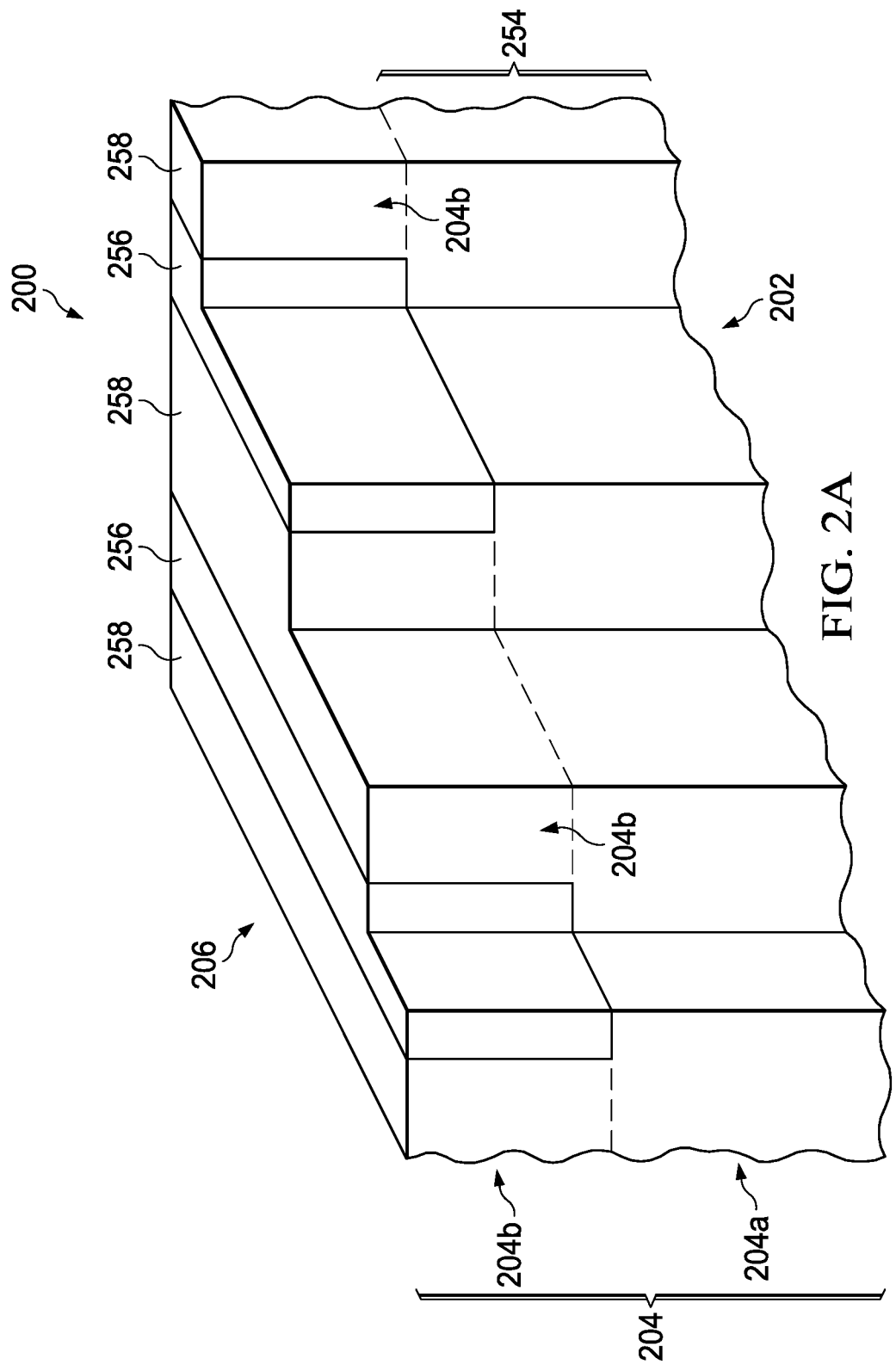
FIG. 2A through FIG. 2J are cross sections of a semiconductor device that includes a folded DEMOS transistor, depicted in stages of another example method of formation.

FIG. 2A through FIG. 2J are cross sections of a semiconductor device that includes a folded DEMOS transistor, depicted in stages of another example method of formation. Referring to FIG. 2A, the semiconductor device 200 is formed in and on a substrate 202. In this example, the substrate 202 may include a base layer 254 which includes a first portion 204a of a semiconductor material 204. The first portion 204a of the semiconductor material 204 may include primarily silicon. In this example, an epitaxy mask 256 is formed on the base layer 254 that exposes the base layer 254 in areas for epitaxial fins 258. The epitaxy mask 256 may include silicon dioxide, silicon nitride, or silicon-doped boron nitride ($Si_xBN$) with 1 atomic percent to 30 atomic percent silicon, by way of example. The epitaxial fins 258 are formed by an epitaxial process, which may be implemented as a vapor phase epitaxial process using silane or disilane, by way of example. The epitaxial fins 258 are part of the substrate 202. The epitaxial fins 258 include a second portion 204b of the semiconductor material 204. In one version of this example, the second portion 204b of the semiconductor material 204 may have a same composition as the first portion 204a of the semiconductor material 204. In an alternate version, the second portion 204b of the semiconductor material 204 may have a different composition from the first portion 204a of the semiconductor material 204. For example, the first portion 204a of the semiconductor material 204 may consist essentially of silicon, and the second portion 204b of the semiconductor material 204 may include silicon with some germanium or silicon with some carbon, to provide enhanced mobility.

The semiconductor material 204 may have a first conductivity type, which is p-type in this example. The semiconductor material 204 may have an average resistivity of 10 ohm-cm to 100 ohm cm, by way of example. Other implementations of the substrate 202 and the semiconductor material 204 are within the scope of this example.

The epitaxy mask 256 is subsequently removed. Silicon dioxide in the epitaxy mask 256 may be removed by a dilute aqueous solution of hydrofluoric acid. Silicon nitride and boron nitride in the epitaxy mask 256 may be removed by a plasma etch process using fluorine radicals.

The semiconductor device 200 includes the folded DEMOS transistor 206. In this example, the folded DEMOS transistor 206 will be described as an n-channel transistor. A p-channel version of the folded DEMOS transistor 206 is within the scope of this example, and may be formed by appropriate changes in polarities of dopants.

Figure 2B:
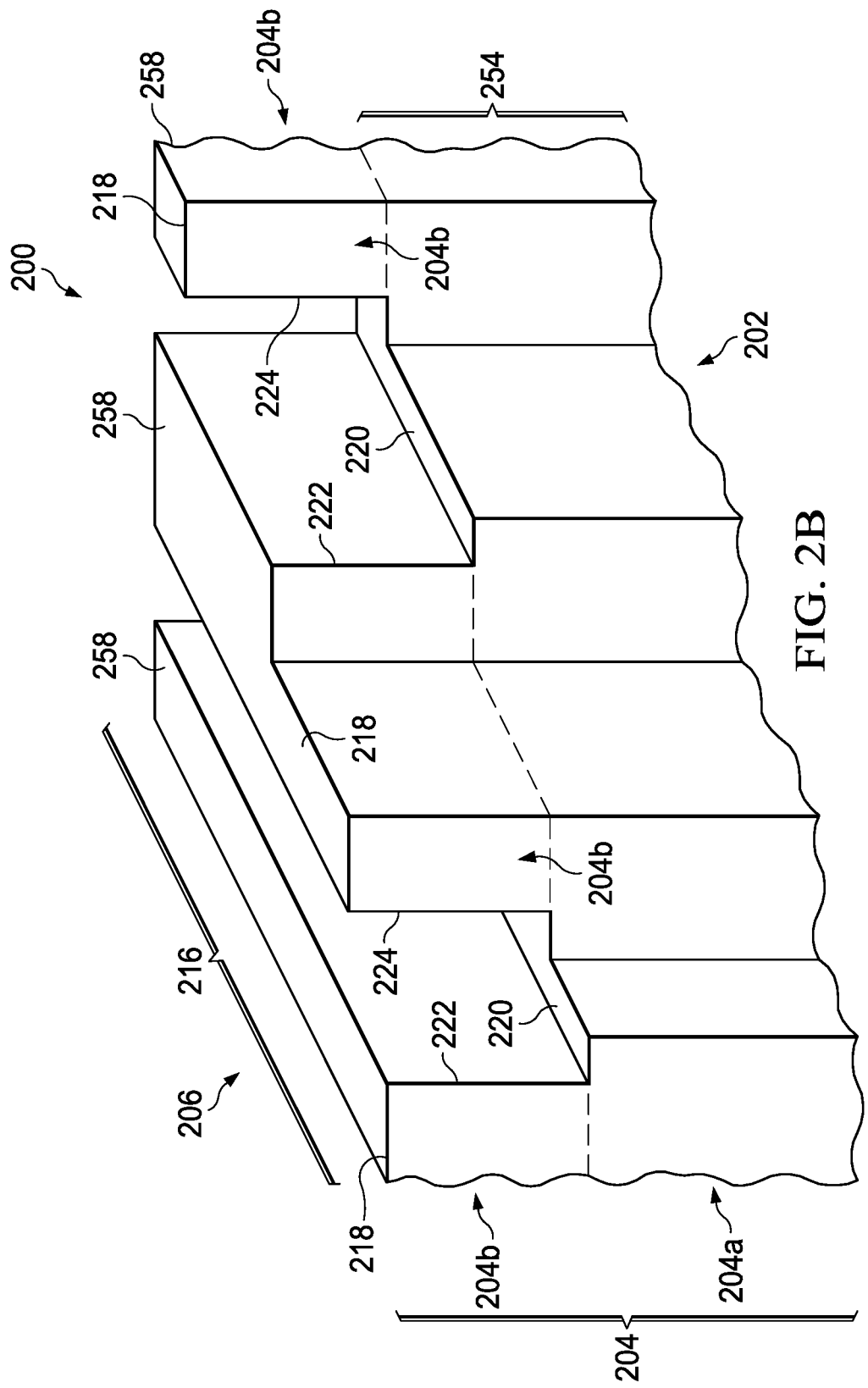

FIG. 2B depicts the semiconductor device 200 after the epitaxy mask 256 of FIG. 2A has been removed. The epitaxial fins 258 may have an average height of 400 nanometers to 1200 nanometers above the base layer 254, by way of example. Having the average height at 400 nanometers to 1200 nanometers may advantageously provide the advantages disclosed in reference to FIG. 1B.

Forming the epitaxial fins 258 forms a corrugated top surface 216 of the semiconductor material 204. The corrugated top surface 216 includes an upper portion 218, a lower portion 220, first lateral portions 222 extending from the upper portion 218 to the lower portion 220, and second lateral portions 224 extending from the upper portion 218 to the lower portion 220. A top surface of the epitaxial fins 258 opposite from a boundary between the first portion 204a of the semiconductor material 204 and the second portion 204b of the semiconductor material 204 may provide the upper portion 218. The boundary between the first portion 204a of the semiconductor material 204 and the second portion 204b of the semiconductor material 204 may provide the lower portion 220. Sidewalls of the epitaxial fins 258 may provide the first lateral portions 222 and the second lateral portions 224. The upper portion 218 may have a width of the epitaxial fins 258 that is 40 percent to 60 percent of the average height of the epitaxial fins 258. The lower portion 220 may have a width between adjacent epitaxial fins 258 that is 40 percent to 60 percent of the average height of the epitaxial fins 258. The upper portion 218 is depicted in FIG. 2B as flat, but may in fact be convex or concave due to non-uniformity in the epitaxial process used to form the epitaxial fins 258. The first lateral portions 222 and the second lateral portions 224 may be angled at 84 degrees to 88 degrees with respect to the upper portion 218, to facilitate subsequent formation of layers between the epitaxial fins 258.

Figure 2C:
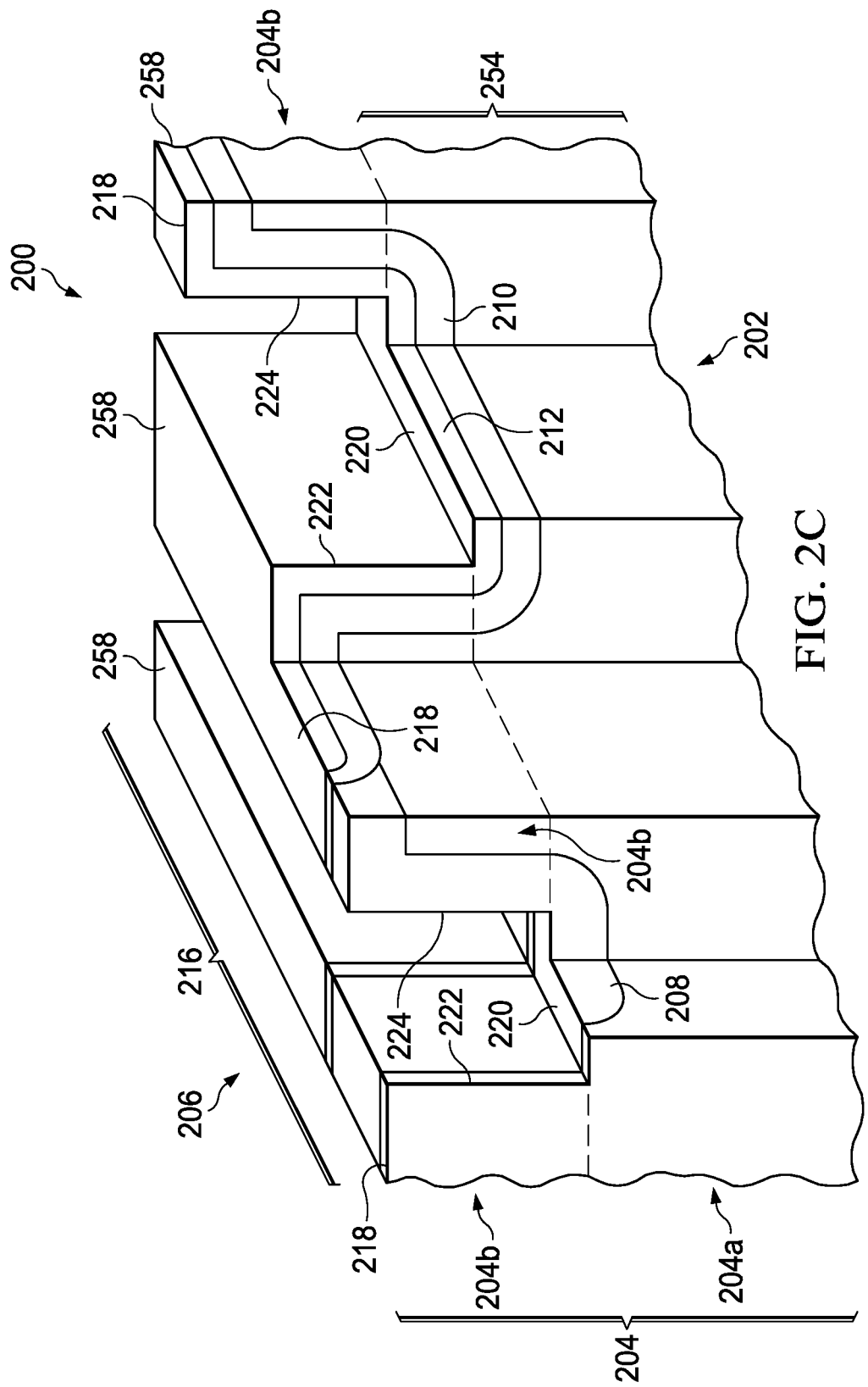

Referring to FIG. 2C, a charge balance region 210 of the folded DEMOS transistor 206 is formed in the semiconductor material 204 of the substrate 202. The charge balance region 210 has the first conductivity type, which is p-type in this example. The charge balance region 210 may be formed by introducing first conductivity type dopants, such as boron in this example, into the semiconductor material 204, along the upper portion 218, the first lateral portions 222, the second lateral portions 224, and the lower portion 220 of the corrugated top surface 216.

A drift region 212 of the folded DEMOS transistor 206 is formed in the semiconductor material 204. The drift region 212 has a second conductivity type, opposite from the first conductivity type. In this example, the second conductivity type is n-type. The drift region 212 may be formed by introducing second conductivity type dopants, such as arsenic or phosphorus in this example, into the semiconductor material 204, along the upper portion 218, the first lateral portions 222, the second lateral portions 224, and the lower portion 220 of the corrugated top surface 216.

In one version of this example, an implant mask, not shown, may be formed over the corrugated top surface 216 to expose an area along the upper portion 218, the first lateral portions 222, the second lateral portions 224, and the lower portion 220 for introducing the first conductivity type dopants and the second conductivity type dopants. The first conductivity type dopants and the second conductivity type dopants may be introduced into the semiconductor material 204 by sequential plasma ion implant processes including a first plasma containing ionized first conductivity type dopants and a second plasma containing ionized second conductivity type dopants. The plasma ion implant process may provide a more uniform distribution of the first conductivity type dopants for the charge balance region 210 and the second conductivity type dopants for the drift region 212 compared to other processes for forming the charge balance region 210 and the drift region 212. The implant mask may subsequently be removed and the semiconductor material 204 may be heated to diffuse and activate the first conductivity type dopants and the second conductivity type dopants. Boron in the first conductivity type dopants diffuses further into the semiconductor material 204 than the second conductivity type dopants, resulting in the charge balance region 210 surrounding the drift region 212, as depicted in FIG. 2C.

In a variant of this version, the first conductivity type dopants and the second conductivity type dopants may be introduced into the semiconductor material 204 by sequential beamline ion implant processes including a first beamline ion implant process for the first conductivity type dopants and a second beamline ion implant process for the second conductivity type dopants. The beamline ion implant processes may be performed in several steps, with different tilt angles to attain more uniform distributions of the dopants along the corrugated top surface 216 compared to implanting at no tilt. The beamline ion implant process may provide more dose control than other implant processes, and may enable formation of the charge balance region 210 and the drift region 212 in a fabrication facility that lacks plasma ion implant capability.

In another variant, the first conductivity type dopants and the second conductivity type dopants may be introduced into the semiconductor material 204 from a doped oxide layer formed on the corrugated top surface 216. The doped oxide layer may provide a lower cost process than a beamline ion implant process or a plasma ion implant process.

In a further variant, the first conductivity type dopants and the second conductivity type dopants may be introduced into the semiconductor material 204 by forming an epitaxial layer of semiconductor material on the corrugated top surface. The epitaxial layer includes the first conductivity type dopants. The semiconductor material 204 is subsequently heated to diffuse and activate the first conductivity type dopants.

The charge balance region 210 may have an average net concentration of first conductivity type dopants of $1\times10^{16}$ $cm^{-3}$ to $1\times10^{18}$ $cm^3$, and the drift region 212 may have an average net concentration of second conductivity type dopants that is 65 percent to 150 percent of the average net concentration of first conductivity type dopants of the charge balance region 210, which may accrue the advantage of reducing an electric field in the drift region 212 during operation of the folded DEMOS transistor 206, as disclosed in reference to FIG. 1A. The drift region 212 extends to the body 208. In this example, the drift region 212 may be surrounded by the charge balance region 210, as depicted in FIG. 1A.

A body 208 of the folded DEMOS transistor 206 is formed in the semiconductor material 204. The body 208 has the first conductivity type, which is p-type in this example. The body 208 may be formed by introducing first conductivity type dopants, such as boron, into the semiconductor material 204, followed by heating the semiconductor material 204 to diffuse and activate the first conductivity type dopants, forming the body 208. The first conductivity type dopants may be introduced into the semiconductor material 204 by a plasma ion implant process, a beamline ion implant process, a doped oxide process, epitaxial growth of a doped semiconductor layer on the corrugated top surface 216, or other method. The body 208 may be formed to have a depth below the upper portion 218 of the corrugated top surface 216 that is similar to a depth below the lower portion 220 of the corrugated top surface 216. Alternatively, the body 208 may be implemented as a portion of the semiconductor material 204 without introducing additional dopants. The body 208 contacts the drift region 212 continuously along the upper portion 218, the first lateral portions 222, the second lateral portions 224, and the lower portion 220 of the corrugated top surface 216.

In an alternate version of this example, the epitaxial fins 258 may have a tapered configuration, so that the drift region 212 between the first lateral portions 222 and the second lateral portions 224 is wider than the body 208 between the first lateral portions 222 and the second lateral portions 224. Having the drift region 212 wider than the body 208 may advantageously provide a lower resistance for the folded DEMOS transistor 206.

Figure 2D:
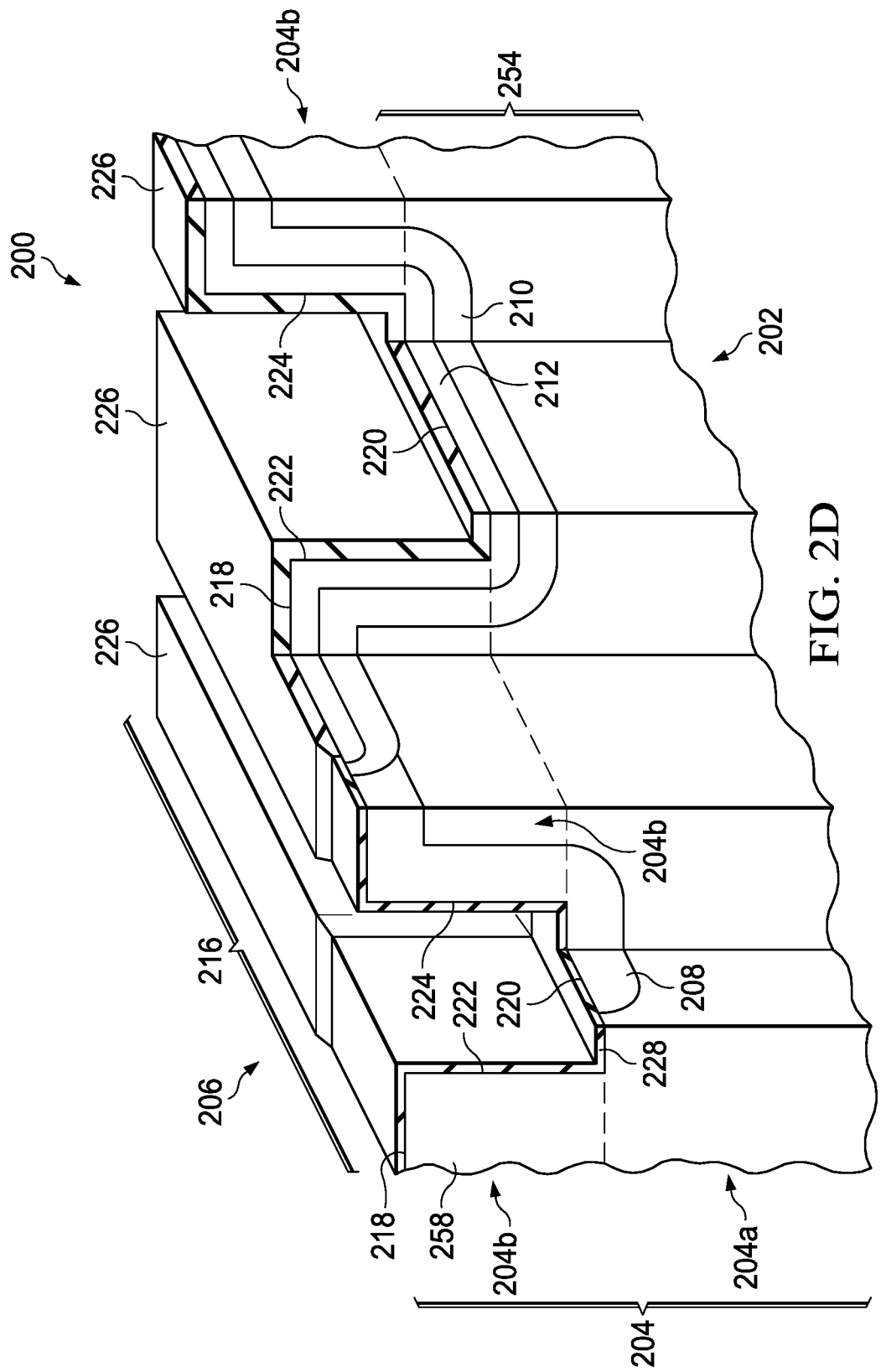

Referring to FIG. 2D, a field plate dielectric layer 226 of the folded DEMOS transistor 206 is formed on the drift region 212, extending continuously along the upper portion 218, the first lateral portions 222, the second lateral portions 224, and the lower portion 220 of the corrugated top surface 216. The field plate dielectric layer 226 extends proximate to the body 208, and may partially overlap the body 208. The field plate dielectric layer 226 may be formed as disclosed in reference to FIG. 1C. Other methods of forming the field plate dielectric layer 226 are within the scope of this example.

A gate dielectric layer 228 is formed on the body 208, extending continuously along the upper portion 218, the first lateral portions 222, the second lateral portions 224, and the lower portion 220 of the corrugated top surface 216. The gate dielectric layer 228 extends to the field plate dielectric layer 226. The gate dielectric layer 228 may be formed as disclosed in reference to FIG. 1D. Other methods of forming the gate dielectric layer 228 are within the scope of this example.

Figure 2E:
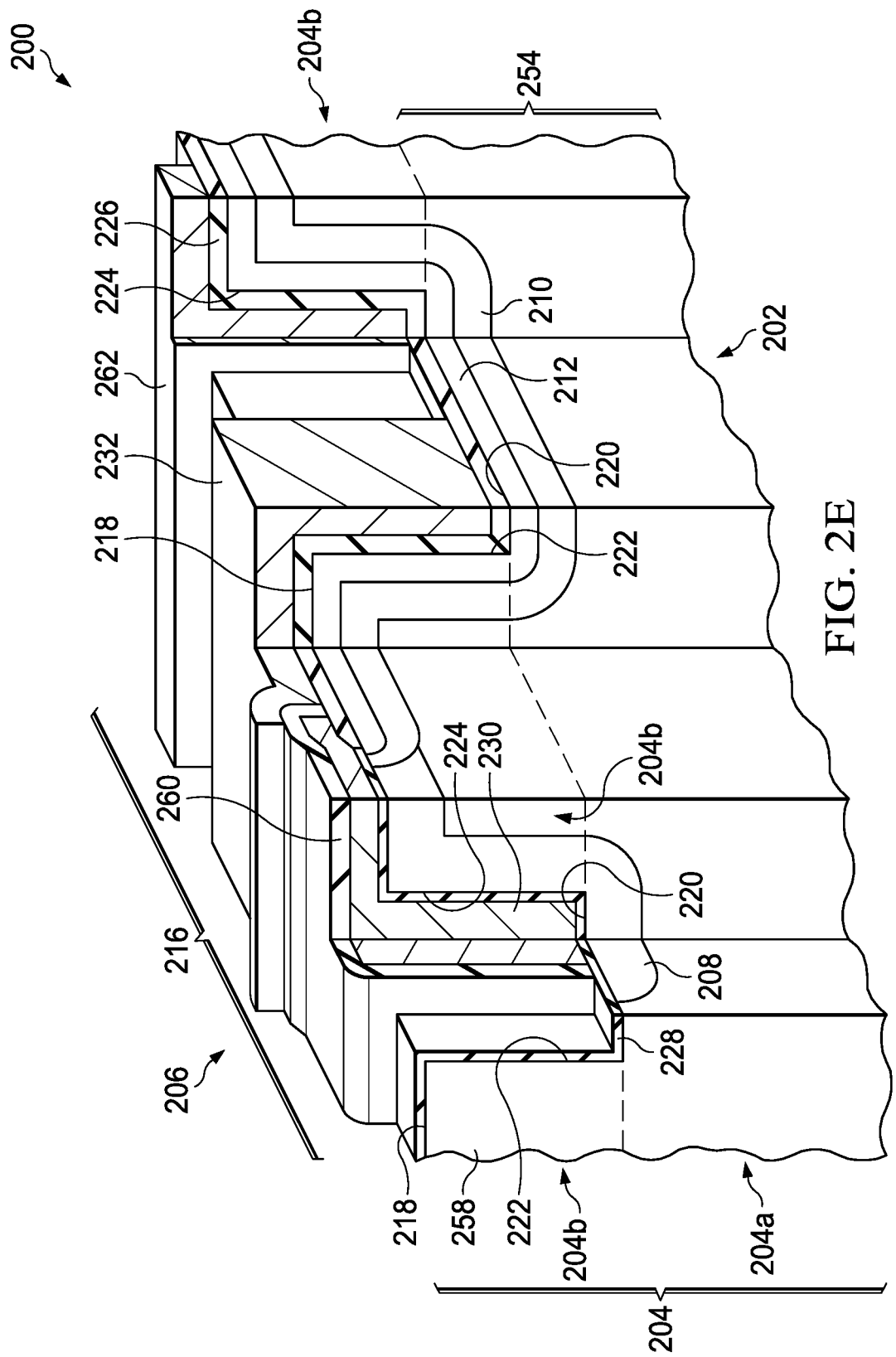

Referring to FIG. 2E, a gate 230 is formed on the gate dielectric layer 228. The gate 230 may overlap partly onto the field plate dielectric layer 226, as indicated in FIG. 2E. The gate 230 extends on the gate dielectric layer 228 continuously along the upper portion 218, the first lateral portions 222, the second lateral portions 224, and the lower portion 220 of the corrugated top surface 216. The gate 230 is electrically conductive, and may be formed as disclosed in reference to FIG. 1E. Other methods of forming the gate 230 are within the scope of this example.

A gate/field plate isolator 260 is formed over the gate 230. The gate/field plate isolator 260 is electrically non-conductive, and may include silicon dioxide, silicon nitride, or silicon oxynitride, by way of example. The gate/field plate isolator 260 may be formed by thermal oxidation of polysilicon in the gate 230, or may be formed by forming one or more layers of dielectric material by CVD processes, followed by forming an etch mask and removing the layers of dielectric material where exposed by the etch mask, leaving the layers of dielectric material under the etch mask to provide the gate/field plate isolator 260. The gate/field plate isolator 260 may be 1 to 2 times as thick as the field plate dielectric layer 226, by way of example.

A field plate 232 and a drain-tied field plate 262 are formed on the field plate dielectric layer 226. The field plate 232 is formed adjacent to gate 230 and extends partway over the drift region 212 adjacent to the gate 230. In this example, the field plate 232 is electrically isolated from the gate 230 by the gate/field plate isolator 260, as indicated in FIG. 2E. The drain-tied field plate 262 is located over the drift region 212 opposite from the gate 230. The drain-tied field plate 262 is separate from the field plate 232. The field plate 232 and the drain-tied field plate 262 may be formed concurrently, by forming a field plate layer, not shown, on the field plate dielectric layer 226. The field plate layer may include polysilicon or other electrically conductive material. A field plate etch mask is formed over the field plate layer that covers areas for the field plate 232 and the drain-tied field plate 262. The field plate layer is removed where exposed by the field plate etch mask, leaving the field plate etch mask on the field plate dielectric layer 226 to provide the field plate 232 and the drain-tied field plate 262. The field plate etch mask is subsequently removed. The field plate 232 extends continuously on the field plate dielectric layer 226 continuously along the upper portion 218, the first lateral portions 222, the second lateral portions 224, and the lower portion 220 of the corrugated top surface 216. The drain-tied field plate 262 may also extend on the field plate dielectric layer 226 continuously along the upper portion 218, the first lateral portions 222, the second lateral portions 224, and the lower portion 220, as indicated in FIG. 2E.

Figure 2F:
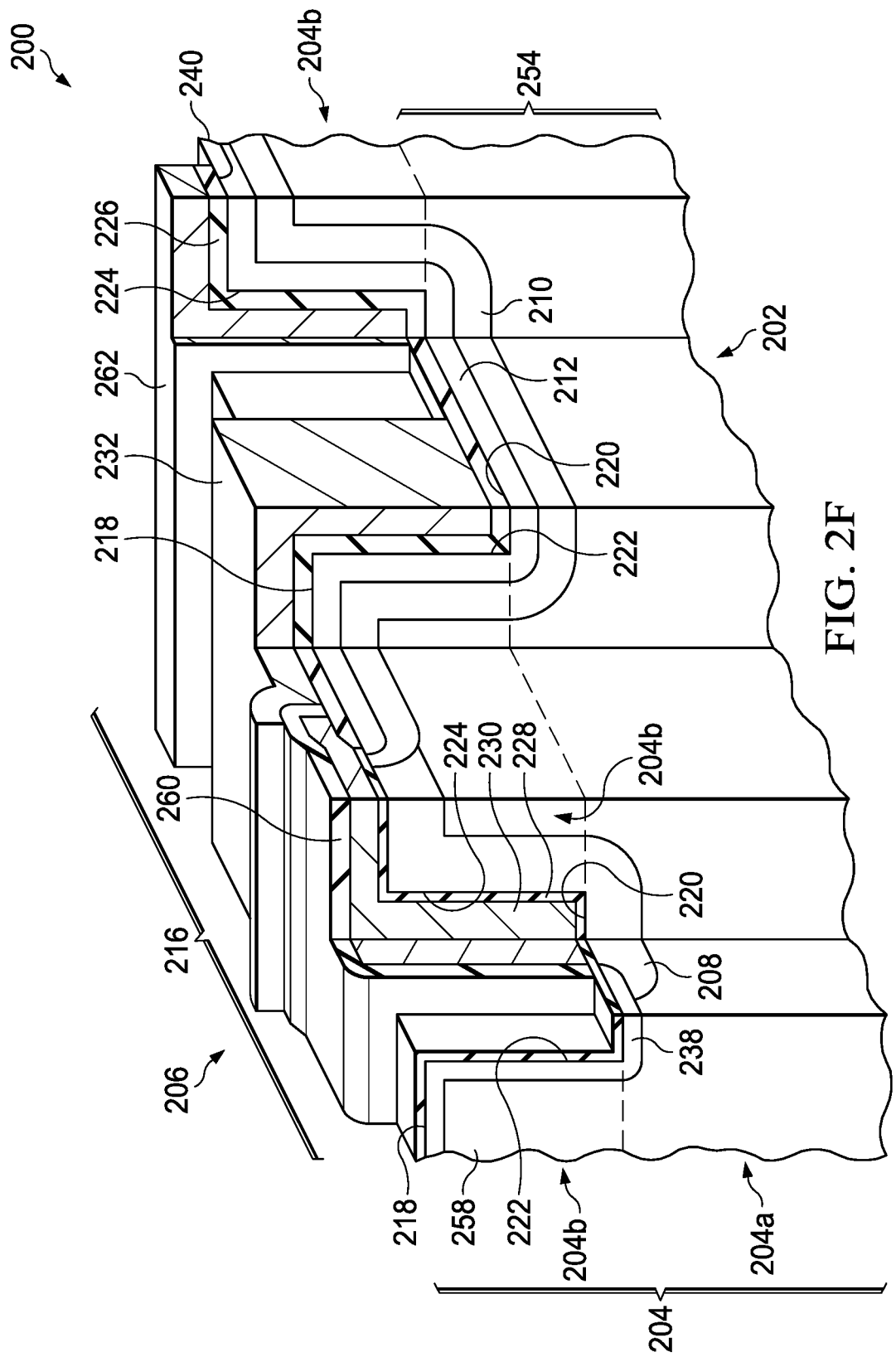

Referring to FIG. 2F, a source 238 and a drain contact region 240 are formed in the semiconductor material 204. The source 238 and the drain contact region 240 have the second conductivity type. The source 238 is formed adjacent to, and contacting, the body 208, opposite from the drift region 212. In this example, the source 238 contacts the body 208 continuously along the upper portion 218, the first lateral portions 222, the second lateral portions 224, and the lower portion 220 of the corrugated top surface 216. The drain contact region 240 directly contacts the drift region 212, opposite from the body 208. The drain contact region 240 may extend continuously along the upper portion 218, the first lateral portions 222, the second lateral portions 224, and the lower portion 220 of the corrugated top surface 216.

The source 238 and the drain contact region 240 may be formed concurrently by implanting second conductivity type dopants into the semiconductor material 204, using an appropriate implant mask, not shown. The source 238 and the drain contact region 240 may have average net concentrations of second conductivity type dopants of $5 \times 10^{18}$ cm$^{-3}$ to $5 \times 10^{20}$ cm$^{-3}$, to provide low resistance connections to the folded DEMOS transistor 206, which may accrue the advantage disclosed in reference to FIG. 1F.

Figure 2G:
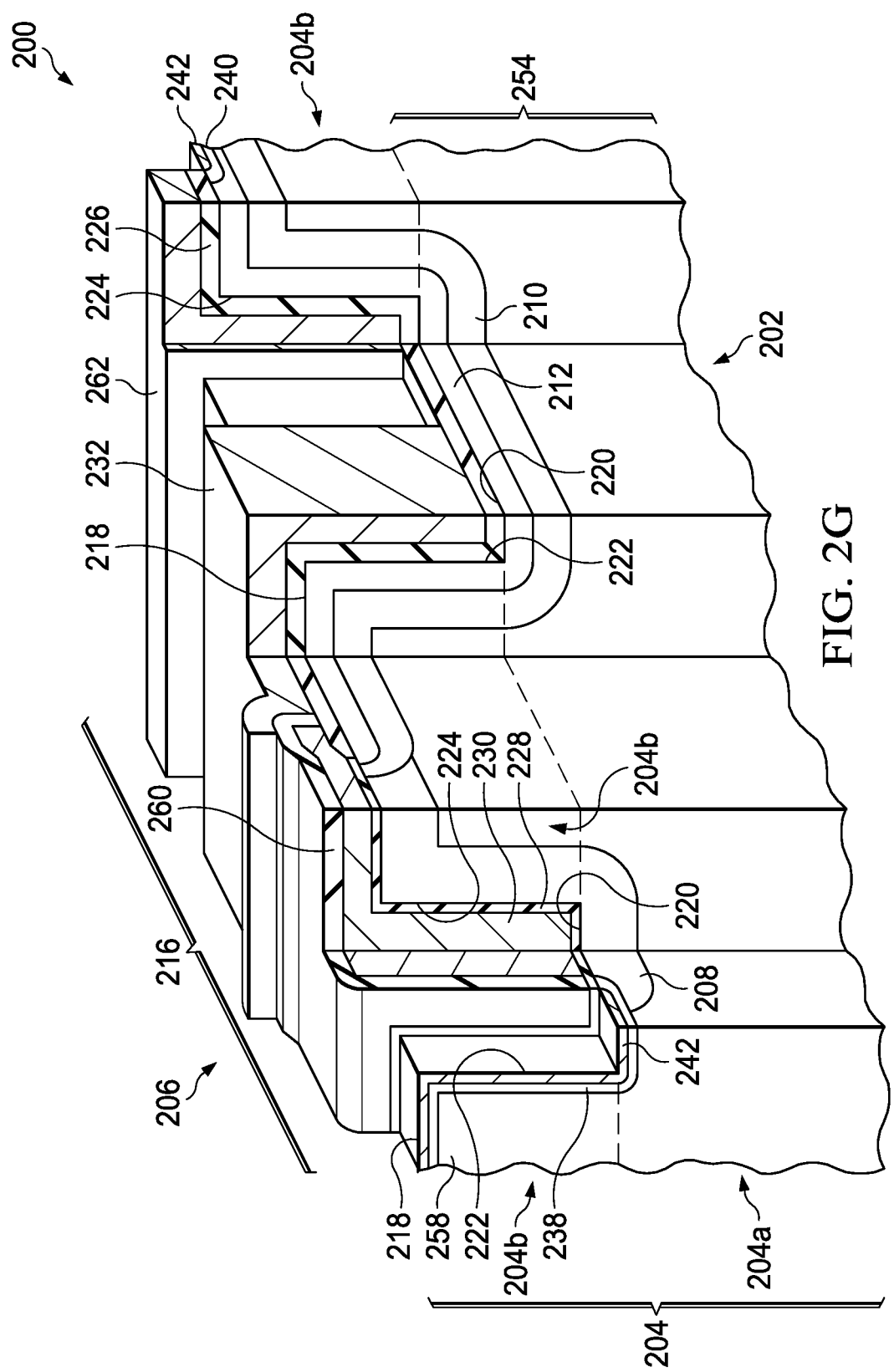

Referring to FIG. 2G, metal silicide 242 may be formed on the source 238 and the drain contact region 240. The metal silicide 242 may be formed as disclosed in reference to FIG. 1G. The metal silicide 242 may advantageously provide low resistance connections to the source 238 and the drain contact region 240. Having the metal silicide 242 extending continuously along the upper portion 218, the first lateral portions 222, the second lateral portions 224, and the lower portion 220 of the corrugated top surface 216 may advantageously provide uniform low resistance connections to the source 238 and the drain contact region 240.

Figure 2H:
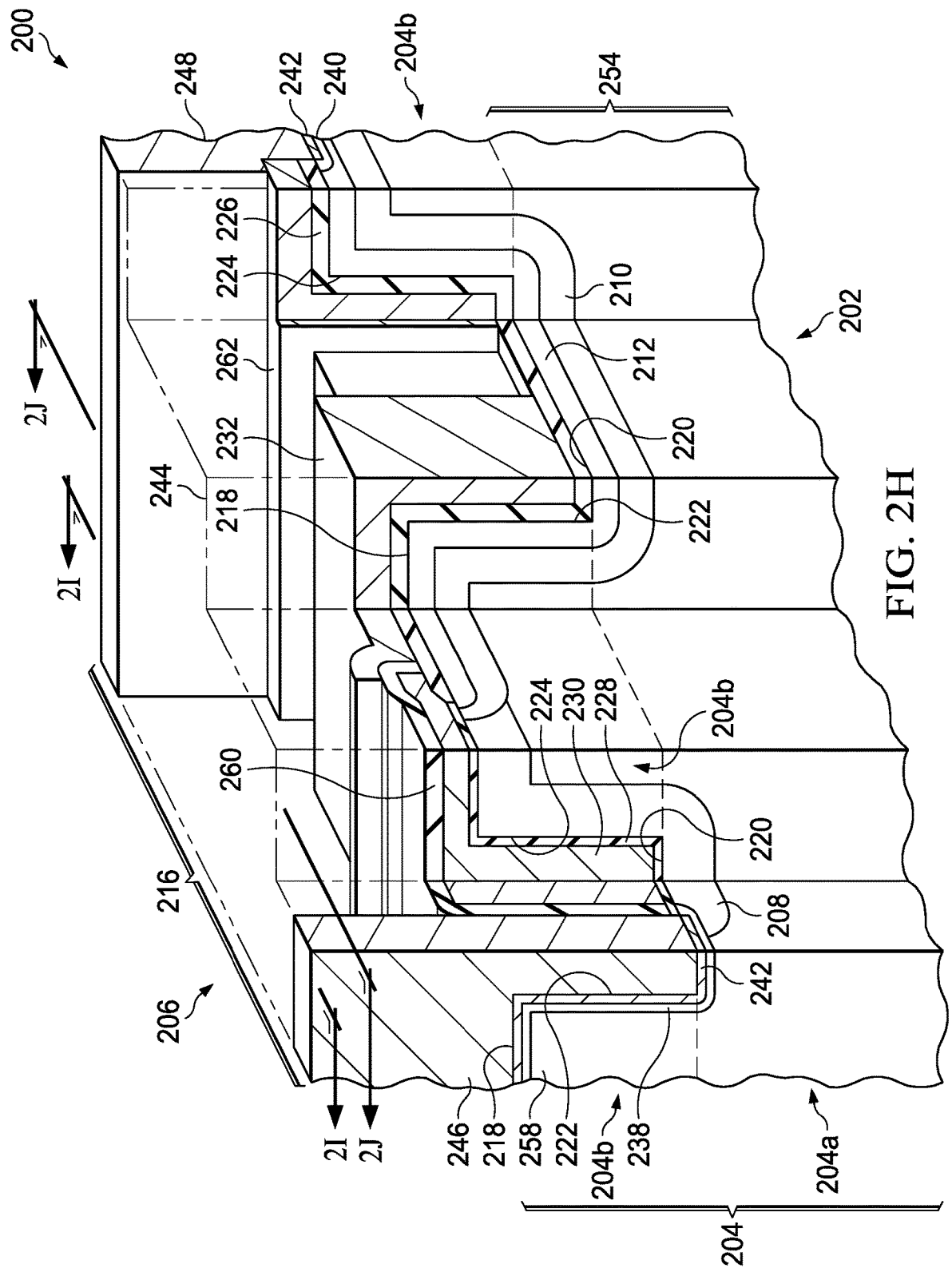

Referring to FIG. 2H, a PMD layer 244 is formed over the folded DEMOS transistor 206, extending over the substrate 202. The PMD layer 244 is electrically non-conductive, and may include one or more layers of dielectric material. For example, the PMD layer may have a layer structure as disclosed in reference to FIG. 1H.

A source contact 246 is formed on the metal silicide 242 on the source 238, and a drain contact 248 is formed on the drain-tied field plate 262 and on the metal silicide 242 on the drain contact region 240. The source contact 246 and the drain contact 248 are electrically conductive, and provide electrical connections to the source 238 and the drain contact region 240, respectively. The source contact 246 and the drain contact 248 may be formed concurrently. The source contact 246 and the drain contact 248 may be formed as disclosed in reference to FIG. 1H, or may be formed by other methods. The source contact 246 and the drain contact 248 may have the structures disclosed in reference to FIG. 1H, or may have other structures. The source contact 246 and the drain contact 248 in this example extend continuously along the upper portion 218, the first lateral portions 222, the second lateral portions 224, and the lower portion 220 of the corrugated top surface 216, which may accrue the advantage of providing more uniform current through the folded DEMOS transistor 206, as disclosed in reference to FIG. 1H.

Figure 2I:
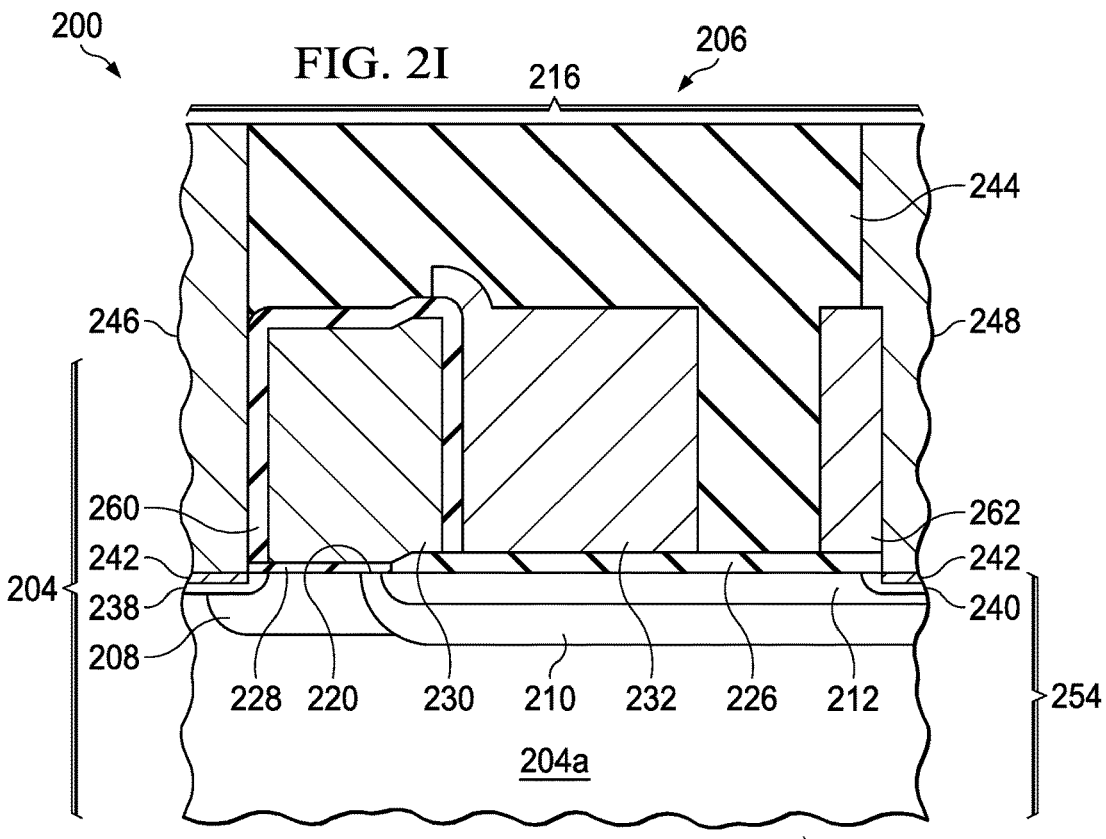

FIG. 2I is a cross section of the semiconductor device 200 between two adjacent epitaxial fins 258, shown in FIG. 2H. The epitaxial fins 258 are out of the plane of FIG. 1J. In this example, the lower portion 220 of the corrugated top surface 216 extends through the source 238 and through the drain contact region 240. The charge balance region 210 extends below the drift region 212 under the lower portion 220 of the corrugated top surface 216. The source 238, the body 208, the gate dielectric layer 228, the gate 230, the field plate dielectric layer 226, the field plate 232, the drain-tied field plate 262, the drift region 212, the drain contact region 240, the metal silicide 242, the source contact 246, and the drain contact 248 extend along the lower portion 220 of the corrugated top surface 216.

Figure 2J:
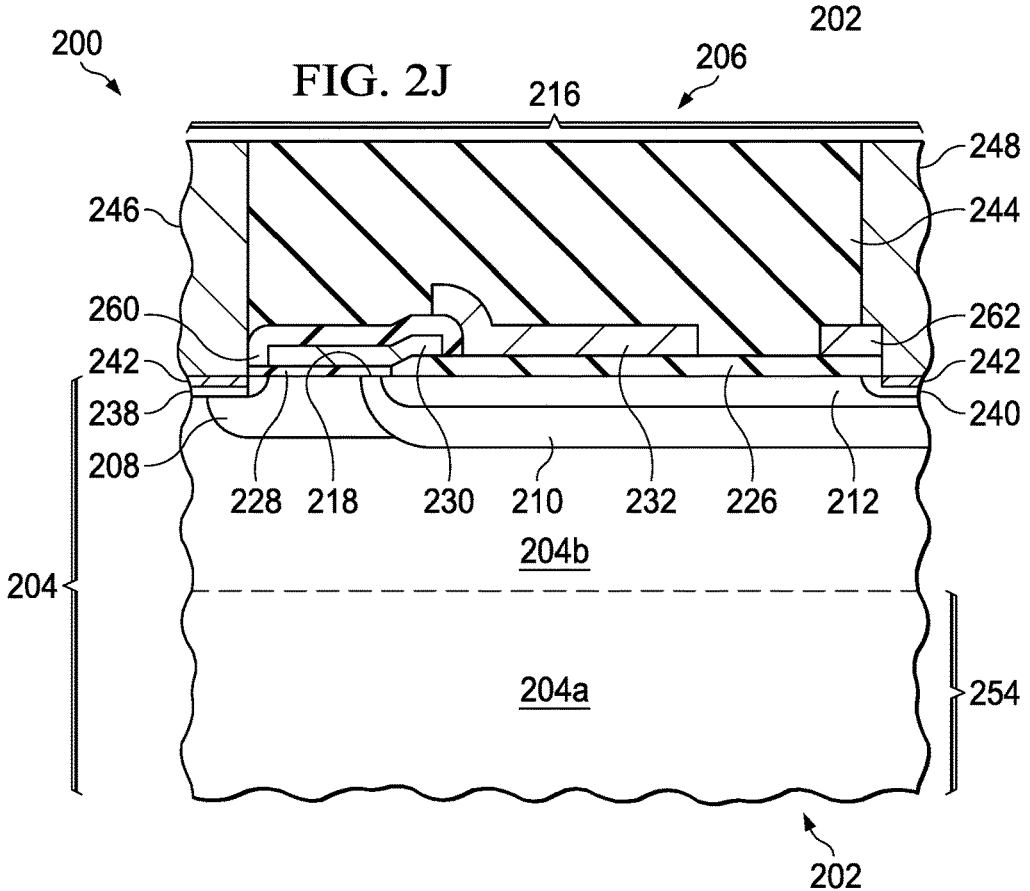

FIG. 2J is a cross section of the semiconductor device 200 through a center of one of the epitaxial fins 258 of FIG. 2H. The drift region 212 contacts the upper portion 218 and extends from the body 208 to the drain contact region 240. The charge balance region 210 extends below the drift region 212, from below the body 208 to below the drain contact region 240. The source 238, the body 208, the gate dielectric layer 228, the gate 230, the field plate dielectric layer 226, the field plate 232, the drain-tied field plate 262, the drift region 212, the drain contact region 240, the metal silicide 242, the source contact 246, and the drain contact 248 extend along the upper portion 218 of the corrugated top surface 216.

Various features of the examples disclosed herein may be combined in other manifestations of example semiconductor devices. For example, the folded DEMOS transistor 106 of FIG. 1A through FIG. 1J may be formed with the lower portion 120 of the corrugated top surface 216 extending completely through the body 108 and the source 138, similar to the folded DEMOS transistor 206 of FIG. 2A through FIG. 2J. The folded DEMOS transistor 106 may be formed with the lower portion 120 of the corrugated top surface 216 extending completely through the drain contact region 140, similar to the folded DEMOS transistor 206. The folded DEMOS transistor 206 may be formed with the lower portion 220 of the corrugated top surface 216 terminating in the body 208 and the source 238, similar to the folded DEMOS transistor 106. The folded DEMOS transistor 206 may be formed with the lower portion 220 of the corrugated top surface 216 terminating in the drain contact region 240, similar to the folded DEMOS transistor 106.

The folded DEMOS transistor 106 may be formed by forming epitaxial fins, rather than the trenches 114, to form the corrugated top surface 116 of the semiconductor material 104, similar to the folded DEMOS transistor 206. The folded DEMOS transistor 206 may be formed by forming trenches, rather than the epitaxial fins 258, to form the corrugated top surface 216 of the semiconductor material 204, similar to the folded DEMOS transistor 106.

The folded DEMOS transistor 106 may be formed by forming the drift region 112 or the charge balance region 110, or both, after forming the corrugated top surface 116 of the semiconductor material 104, similar to the method disclosed for the folded DEMOS transistor 206. The folded DEMOS transistor 206 may be formed by forming the drift region 212 or the charge balance region 210, or both, before forming the corrugated top surface 216 of the semiconductor material 204, similar to the method disclosed for the folded DEMOS transistor 106.

The folded DEMOS transistor 106 may be formed to have a portion of the semiconductor material 104 that is free of the charge balance region 110 extending under the upper portion 118, between the first lateral portions 122 and the second lateral portions 124, similar to the folded DEMOS transistor 206. The folded DEMOS transistor 206 may be formed to have the charge balance region 110 fill the substrate 202 between the drift region 212 along the first lateral portions 222 and the second lateral portions 224, similar to the folded DEMOS transistor 106.

The folded DEMOS transistor 106 may be formed to have the gate 130 separate from the field plate 132, similar to the folded DEMOS transistor 206. The folded DEMOS transistor 206 may be formed to have the gate 230 continuous with the field plate 232, similar to the folded DEMOS transistor 106.

The folded DEMOS transistor 106 may be formed to include a drain-tied field plate, similar to the drain-tied field plate 262 of the folded DEMOS transistor 206. The folded DEMOS transistor 206 may be formed to include an intermediate drain region, similar to the intermediate drain region 136 of the folded DEMOS transistor 106.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
a substrate including a semiconductor material, the semiconductor material having a corrugated top surface, the corrugated top surface including an upper portion, a lower portion, a first lateral portion extending from the upper portion to the lower portion, and a second lateral portion extending from the upper portion to the lower portion; and
a folded drain extended metal oxide semiconductor (DEMOS) transistor, including:
a body in the semiconductor material, the body having a first conductivity type, the body extending continuously along the upper portion, the first lateral portion, the second lateral portion, and the lower portion;
a gate dielectric layer on the body, the gate dielectric layer extending continuously along the upper portion, the first lateral portion, the second lateral portion, and the lower portion;
a gate on the gate dielectric layer, the gate extending continuously along the upper portion, the first lateral portion, the second lateral portion, and the lower portion; and
a drift region in the semiconductor material, the drift region having a second conductivity type, opposite from the first conductivity type, the drift region extending continuously along the upper portion, the first lateral portion, the second lateral portion, and the lower portion, and contacting the body continuously along the upper portion, the first lateral portion, the second lateral portion, and the lower portion.

2. The semiconductor device of claim 1, wherein the folded DEMOS transistor further includes:
a field plate dielectric layer on the drift region, the field plate dielectric layer extending continuously along the upper portion, the first lateral portion, the second lateral portion, and the lower portion; and
a field plate on the field plate dielectric layer, extending continuously along the upper portion, the first lateral portion, the second lateral portion, and the lower portion.

3. The semiconductor device of claim 2, wherein the folded DEMOS transistor further includes a charge balance region in the semiconductor material contacting the drift region, the charge balance region having the first conductivity type.

4. The semiconductor device of claim 3, wherein the charge balance region contacts the drift region between the first lateral portion and the second lateral portion.

5. The semiconductor device of claim 1, wherein:
the folded DEMOS transistor includes a source in the semiconductor material contacting the body, the source having the second conductivity type; and
the source extends continuously along the upper portion, the first lateral portion, the second lateral portion, and the lower portion, contacting the body continuously along the upper portion, the first lateral portion, the second lateral portion, and the lower portion.

6. The semiconductor device of claim 5, wherein the folded DEMOS transistor includes a source contact contacting the source, the source contact contacting the source continuously along the upper portion, the first lateral portion, the second lateral portion, and the lower portion.

7. The semiconductor device of claim 1, wherein:
the folded DEMOS transistor includes a drain contact region in the semiconductor material electrically coupled to the drift region, the drain contact region having the second conductivity type, the drain contact region having an average net concentration of second conductivity type dopants higher than the drift region; and
the drain contact region extends continuously along the upper portion, the first lateral portion, the second lateral portion, and the lower portion, electrically coupled to the drift region continuously along the upper portion, the first lateral portion, the second lateral portion, and the lower portion.

8. The semiconductor device of claim 7, wherein the folded DEMOS transistor includes an intermediate drain region in the semiconductor material between the drift region and the drain contact region, the intermediate drain region electrically coupling the drain contact region to the drift region, the intermediate drain region having the second conductivity type, the intermediate drain region having an average net concentration of second conductivity type dopants higher than the drift region, and the drain contact region having an average net concentration of second conductivity type dopants higher than the intermediate drain region.

9. The semiconductor device of claim 7, wherein the folded DEMOS transistor includes a drain contact contacting the drain contact region continuously along the upper portion, the first lateral portion, the second lateral portion, and the lower portion.

10. The semiconductor device of claim 7, wherein the folded DEMOS transistor includes a drain-tied field plate electrically coupled to the drain contact region, the drain-tied field plate extending over a portion of the drift region.

11. A method of forming a semiconductor device, comprising:
providing a substrate including at least a portion of a semiconductor material;
forming a corrugated top surface of the semiconductor material, the corrugated top surface including an upper portion, a lower portion, a first lateral portion extending from the upper portion to the lower portion, and a second lateral portion extending from the upper portion to the lower portion;
forming a body of a folded drain extended metal oxide semiconductor (DEMOS) transistor in the semiconductor material, the body having a first conductivity type, the body extending continuously along the upper portion, the first lateral portion, the second lateral portion, and the lower portion;
forming a drift region of the folded DEMOS transistor in the semiconductor material, the drift region having a second conductivity type opposite from the first conductivity type, the drift region extending continuously along the upper portion, the first lateral portion, the second lateral portion, and the lower portion, and contacting the body continuously along the upper portion, the first lateral portion, the second lateral portion, and the lower portion;
forming a gate dielectric layer of the folded DEMOS transistor on the body, the gate dielectric layer extending continuously along the upper portion, the first lateral portion, the second lateral portion, and the lower portion; and
forming a gate of the folded DEMOS transistor on the gate dielectric layer, the gate extending continuously along the upper portion, the first lateral portion, the second lateral portion, and the lower portion.

12. The method of claim 11, further comprising:
forming a field plate dielectric layer of the folded DEMOS transistor on the drift region, the field plate dielectric layer extending continuously along the upper portion, the first lateral portion, the second lateral portion, and the lower portion; and
forming a field plate on the field plate dielectric layer, the field plate extending continuously along the upper portion, the first lateral portion, the second lateral portion, and the lower portion.

13. The method of claim 11, wherein forming the corrugated top surface includes removing a portion of the semiconductor material to form a trench in the semiconductor material, sidewalls of the trench providing the first lateral portion and the second lateral portion, a bottom of the trench providing the lower portion, and a surface of the semiconductor material adjacent to the trench providing the upper portion.

14. The method of claim 11, wherein:
forming the corrugated top surface includes forming an epitaxial fin of the semiconductor material by an epitaxial process, a top surface of the epitaxial fin providing the upper portion, sidewalls of the epitaxial fin providing the first lateral portion and the second lateral portion, and a surface of the semiconductor material adjacent to the epitaxial fin providing the lower portion.

15. The method of claim 11, wherein forming the drift region includes a process selected from the group consisting of:
implanting second conductivity type dopants by a plasma ion implant process into the semiconductor material along the upper portion, the first lateral portion, the second lateral portion, and the lower portion;
forming an epitaxial layer of the semiconductor material on the semiconductor material along the upper portion, the first lateral portion, the second lateral portion, and the lower portion; and
implanting second conductivity type dopants by a beamline ion implant process into the semiconductor material along the upper portion, the first lateral portion, the second lateral portion, and the lower portion.

16. The method of claim 11, further comprising forming a charge balance region in the semiconductor material, the charge balance region contacting the drift region, the charge balance region having the first conductivity type.

17. The method of claim 11, further comprising:
forming a source of the folded DEMOS transistor in the semiconductor material, the source having the second conductivity type, the source extending continuously along the upper portion, the first lateral portion, the second lateral portion, and the lower portion, contacting the body continuously along the upper portion, the first lateral portion, the second lateral portion, and the lower portion; and
forming a source contact electrically coupled to the source continuously along the upper portion, the first lateral portion, the second lateral portion, and the lower portion.

18. The method of claim 17, further comprising forming a metal silicide on the source, the metal silicide extending continuously along the upper portion, the first lateral portion, the second lateral portion, and the lower portion, wherein the source contact is electrically coupled to the source through the metal silicide.

19. The method of claim 11, further comprising:
forming a drain contact region of the folded DEMOS transistor in the semiconductor material, the drain contact region having the second conductivity type, the drain contact region extending continuously along the upper portion, the first lateral portion, the second lateral portion, and the lower portion, electrically coupled to the drift region continuously along the upper portion, the first lateral portion, the second lateral portion, and the lower portion, the drain contact region, the drain contact region having an average net concentration of second conductivity type dopants higher than the drift region; and
forming a drain contact electrically coupled to the drain contact region continuously along the upper portion, the first lateral portion, the second lateral portion, and the lower portion.

20. The method of claim 19, further comprising forming a metal silicide on the drain contact region, the metal silicide extending continuously along the upper portion, the first lateral portion, the second lateral portion, and the lower portion, wherein the drain contact is electrically coupled to the drain contact region through the metal silicide.

* * * * *